United States Patent
Yamazaki

(10) Patent No.: US 8,353,459 B2
(45) Date of Patent: Jan. 15, 2013

(54) SEMICONDUCTOR DEVICE AND METHOD FOR MANUFACTURING THE SAME

(75) Inventor: Shunpei Yamazaki, Setagaya (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 1107 days.

(21) Appl. No.: 12/076,997

(22) Filed: Mar. 26, 2008

(65) Prior Publication Data

US 2008/0245880 A1 Oct. 9, 2008

(30) Foreign Application Priority Data

Apr. 6, 2007 (JP) ................... 2007-100062

(51) Int. Cl.
*G06K 21/06* (2006.01)
*H01L 23/495* (2006.01)

(52) U.S. Cl. ........................ 235/492; 257/666

(58) Field of Classification Search .............. 235/492, 235/441; 257/491, 66, 704, 679; 438/618; 336/220, 200; 340/572.8; 343/867
See application file for complete search history.

(56) References Cited

U.S. PATENT DOCUMENTS

| | | | | |
|---|---|---|---|---|
| 5,801,432 A * | 9/1998 | Rostoker et al. | ............... | 257/666 |
| 6,373,447 B1 * | 4/2002 | Rostoker et al. | ............... | 257/491 |
| 6,421,013 B1 * | 7/2002 | Chung | ............... | 235/441 |
| 6,837,438 B1 | 1/2005 | Takasugi et al. | | |
| 7,167,073 B2 * | 1/2007 | Hatano | ............... | 336/200 |
| 7,621,457 B2 * | 11/2009 | Ato et al. | ............... | 235/492 |
| 7,658,333 B2 * | 2/2010 | Koyama et al. | ............... | 235/492 |
| 7,683,838 B2 | 3/2010 | Koyama et al. | | |
| 2002/0001937 A1 * | 1/2002 | Kikuchi et al. | ............... | 438/618 |
| 2005/0133790 A1 * | 6/2005 | Kato | ............... | 257/66 |
| 2006/0071324 A1 * | 4/2006 | Lu et al. | ............... | 257/704 |
| 2007/0008238 A1 * | 1/2007 | Liu et al. | ............... | 343/867 |
| 2007/0020932 A1 | 1/2007 | Maruyama et al. | | |
| 2007/0158440 A1 * | 7/2007 | Nishizawa et al. | ............... | 235/492 |
| 2007/0247268 A1 * | 10/2007 | Oya et al. | ............... | 336/200 |
| 2007/0252703 A1 * | 11/2007 | Kato et al. | ............... | 340/572.8 |
| 2008/0191332 A1 | 8/2008 | Koyama et al. | | |
| 2009/0277966 A1 * | 11/2009 | Kato et al. | ............... | 235/492 |

FOREIGN PATENT DOCUMENTS

| | | |
|---|---|---|
| JP | 2000-137779 | 5/2000 |
| JP | 2000-295024 | 10/2000 |
| JP | 2001-156524 | 6/2001 |
| JP | 2001-251115 | 9/2001 |
| JP | 2002-368525 | 12/2002 |
| JP | 2005-094319 | 4/2005 |
| WO | 02/089157 | 11/2002 |

* cited by examiner

*Primary Examiner* — Thien T Mai
(74) *Attorney, Agent, or Firm* — Eric J. Robinson; Robinson Intellectual Property Law Office, P.C.

(57) ABSTRACT

It is an object of the present invention to suppress poor connection or increase in contact resistance even in the case where an antenna is formed over an integrated circuit portion. An integrated circuit portion having a first conductive film is formed over a substrate, an insulating film is formed over the integrated circuit portion, a second conductive film serving as an antenna is formed over the insulating film, an opening is formed in the insulating film and the second conductive film to expose the first conductive film, and a third conductive film is formed in the opening and over a top surface of the second conductive film by a plating process to electrically connect the first conductive film and the second conductive film.

22 Claims, 18 Drawing Sheets

FIG. 6A
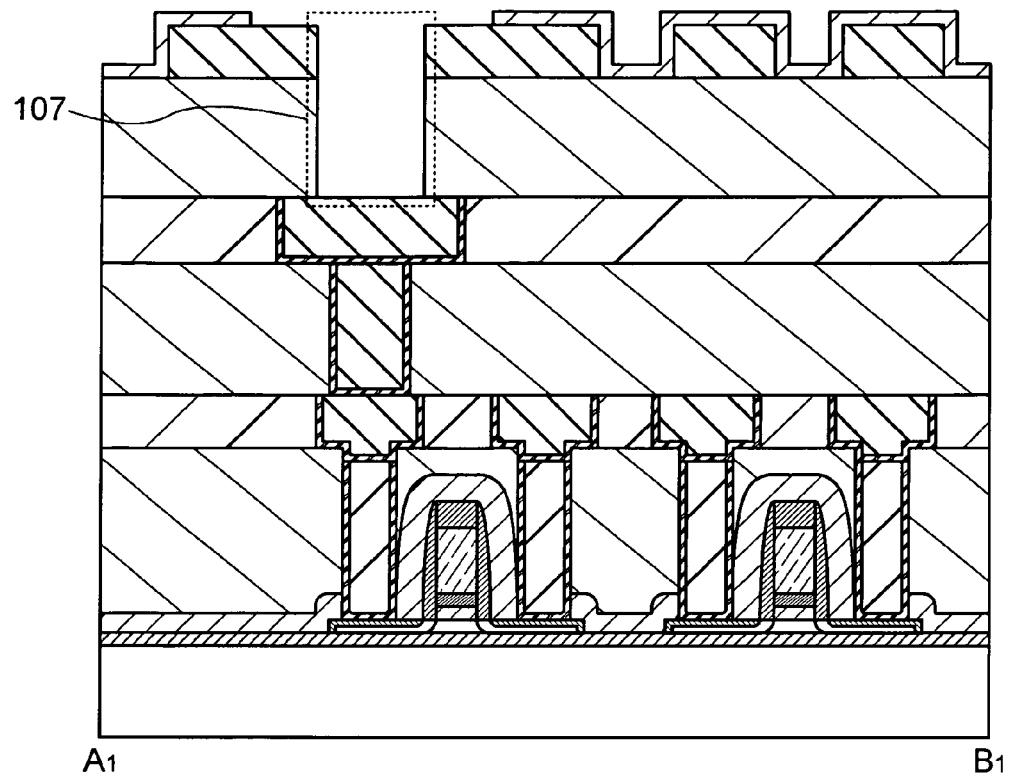
107
A1　　　　　　　　　　　　　　　　B1
FIG. 6B　　　　　　　　111
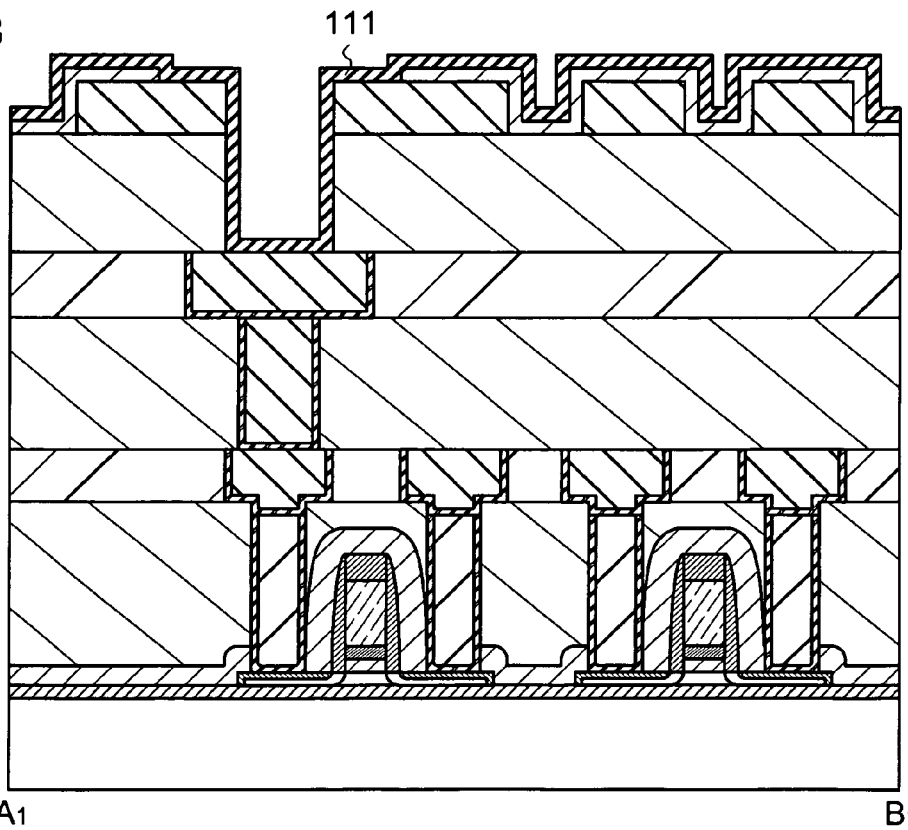
A1　　　　　　　　　　　　　　　　B1

1618

1621

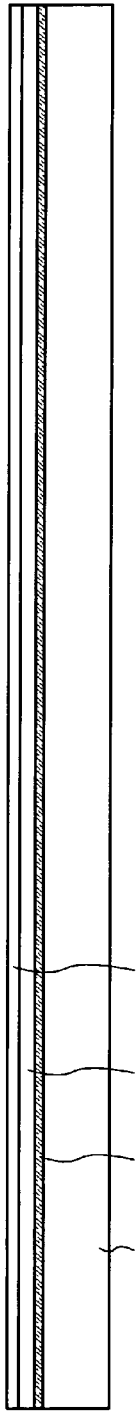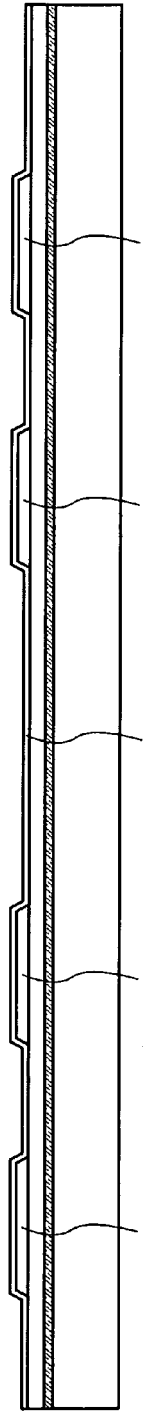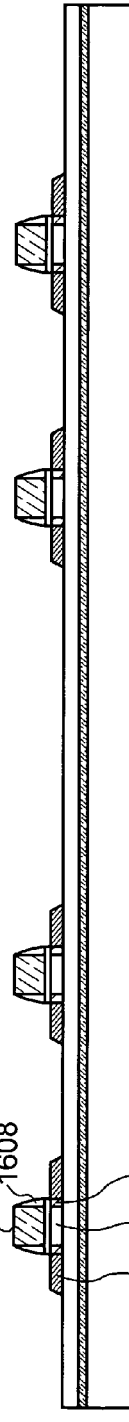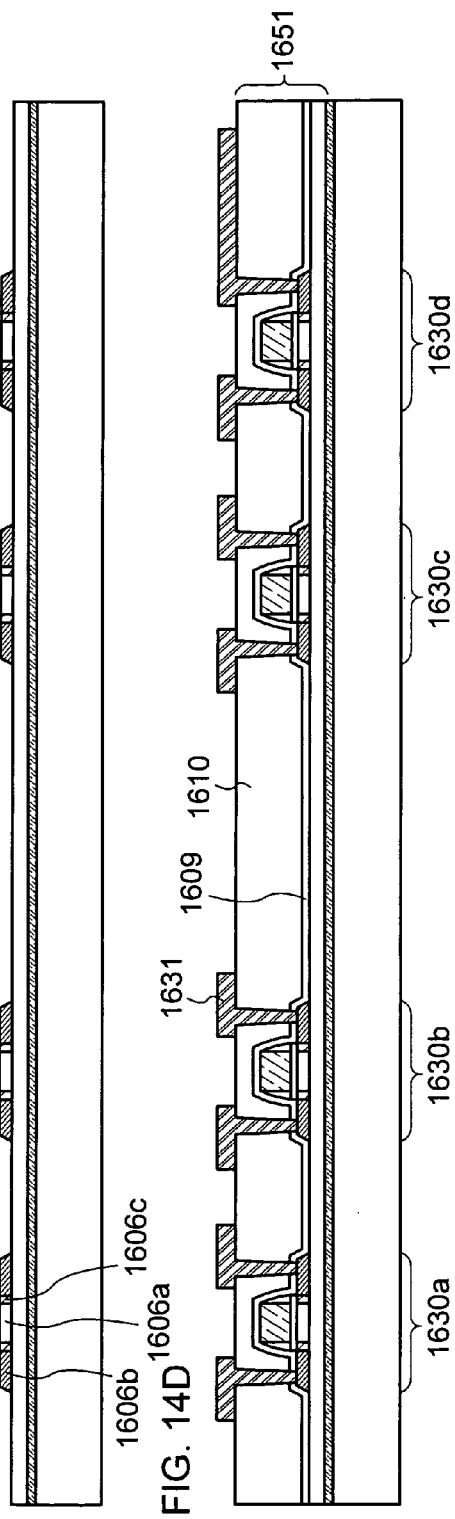

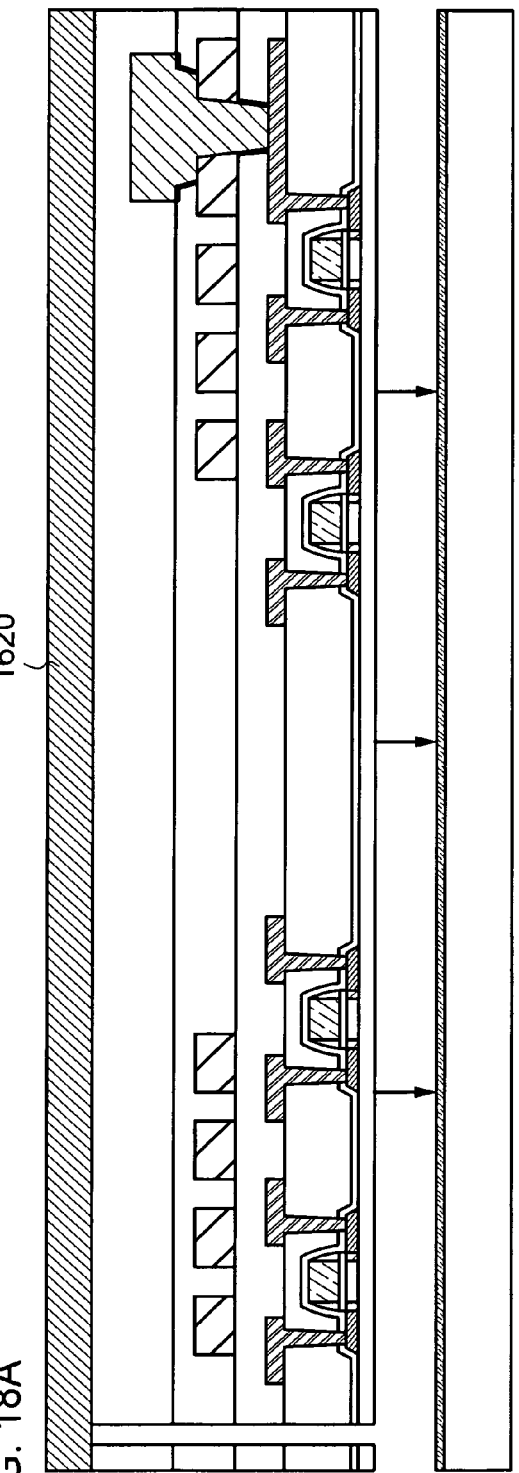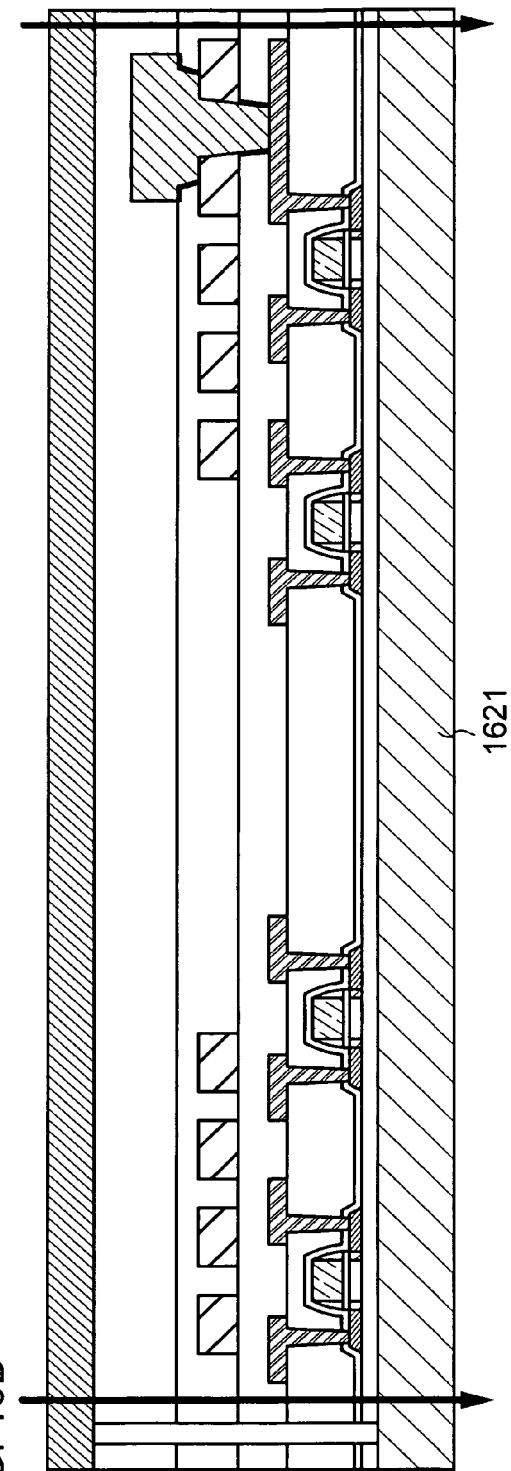
FIG. 18A
FIG. 18B

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device. In particular, the present invention relates to a semiconductor device which can transmit and receive information without contact and a method for manufacturing the semiconductor device.

2. Description of the Related Art

In recent years, an individual identification technology utilizing electromagnetic waves for wireless communication has attracted attention. In particular, as a semiconductor device which communicates data by wireless communication, an individual identification technology using a semiconductor device (also referred to as a radio frequency identification (RFID) tag, an integrated circuit (IC) tag, an IC chip, an RF tag, a wireless tag, or an electronic tag) utilizing RFID has attracted attention. The individual identification technology using such a semiconductor device utilizing RFID has been useful for production, management, or the like of individual objects, and application to personal authentication has been promoted.

Such a semiconductor device obtains operating power from an electromagnetic wave received from a reader/writer and exchanges data with the reader/writer. The semiconductor device includes an antenna for transmitting and receiving such an electromagnetic wave and an integrated circuit portion. In general, the antenna and the integrated circuit portion are formed separately and then connected to each other.

In the case where the antenna and the integrated circuit portion are formed separately and connected to each other, it is necessary that the two be electrically connected to each other. Connection between a fine terminal of the integrated circuit portion and the antenna is accompanied by technical difficulty, resulting in reduction of yield. Further, stress is applied to a connection point when the semiconductor device is used, which becomes a cause of disconnection or poor connection. In particular, it is expected that poor connection is problematic in the case of using a flexible semiconductor device.

In order to solve the above-described problem of poor connection between the antenna and the integrated circuit portion, a non-contact IC module is known, in which an antenna (also referred to as an on-chip antenna or an on-chip coil) is formed over an integrated circuit portion (for example, Patent Document 1: Japanese Published Patent Application No. 2000-137779).

However, in the case where an antenna is formed over an integrated circuit portion, it is necessary that a conductive film serving as an antenna be further reduced in line width, shape, or the like as the integrated circuit portion becomes fine. As a result, poor connection between the integrated circuit portion and the conductive film serving as an antenna or increase in contact resistance therebetween may be a concern. Further, in the case where the integrated circuit portion is layered, a problem of poor connection may occur which is caused by increase in depth of an opening through which the integrated circuit portion and the conductive film serving as an antenna are connected to each other.

SUMMARY OF THE INVENTION

In view of the foregoing problem, it is an object of the present invention to suppress poor connection or increase in contact resistance even in the case where an antenna is formed over an integrated circuit portion.

One aspect of a semiconductor device of the present invention includes an integrated circuit portion which is provided over a substrate, an insulating film which is provided over the integrated circuit portion, a conductive film serving as an antenna which is provided over the insulating film, and a contact conductive film which electrically connects the integrated circuit portion and the conductive film serving as an antenna. In the semiconductor device, the insulating film and the conductive film serving as an antenna have an opening, and the contact conductive film is provided in the opening and over a top surface of the conductive film serving as an antenna.

Another aspect of a semiconductor device of the present invention includes an integrated circuit portion which is provided over a substrate, an antenna which is provided over the integrated circuit portion, and a contact conductive film which electrically connects the integrated circuit portion and the antenna. In the semiconductor device, the antenna is provided by stacking a plurality of conductive films with an insulating film alternately interposed therebetween, the plurality of conductive films and the insulating films have an opening, and the contact conductive film is provided in the opening.

One aspect of a method for manufacturing a semiconductor device of the present invention includes the steps of forming an integrated circuit portion having a first conductive film over a substrate, forming an insulating film over the integrated circuit portion, forming a second conductive film serving as an antenna over the insulating film, forming an opening in the insulating film and the second conductive film to expose the first conductive film, and forming a third conductive film in the opening and over a top surface of the second conductive film by a plating process to electrically connect the first conductive film and the second conductive film.

Another aspect of a method for manufacturing a semiconductor device of the present invention includes the steps of forming an integrated circuit portion having a first conductive film over a substrate, forming a first insulating film over the integrated circuit portion, stacking a plurality of second conductive films serving as an antenna over the first insulating film with a second insulating film alternately interposed therebetween, forming an opening in the first insulating film, the second conductive films, and the second insulating films to expose the first conductive film, and forming a third conductive film in the opening by a plating process to electrically connect the first conductive film and the plurality of second conductive films.

According to the present invention, poor connection or increase in contact resistance can be suppressed even in the case where an antenna is formed over an integrated circuit portion.

BRIEF DESCRIPTION OF THE DRAWINGS

In the accompanying drawings:

FIGS. 6A and 6B are cross-sectional views showing an example of a method for manufacturing a semiconductor device of the present invention;

FIGS. 14A to 14D are cross-sectional views showing an example of a method for manufacturing a semiconductor device of the present invention;

FIGS. 18A and 18B are cross-sectional views showing an example of a method for manufacturing a semiconductor device of the present invention.

DETAILED DESCRIPTION OF THE INVENTION

Embodiment Mode

Figure 1:
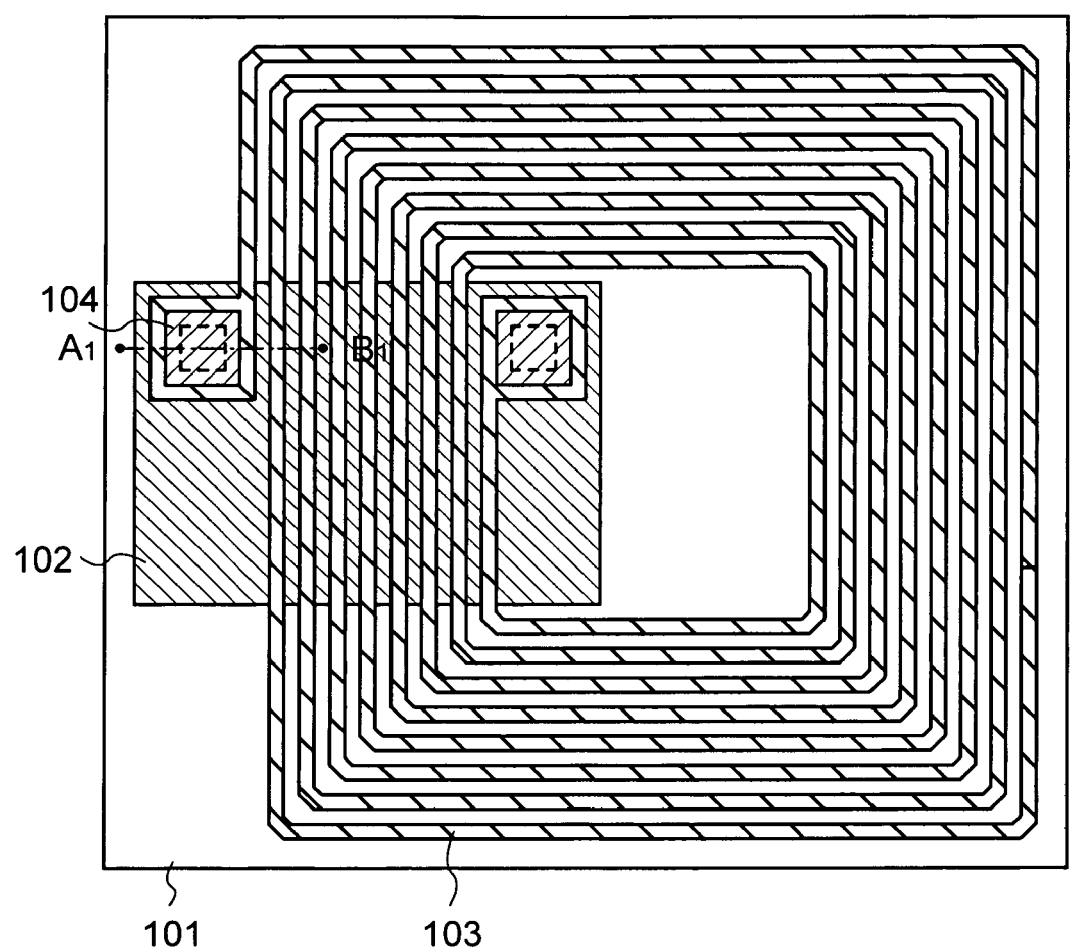
FIG. 1 is a top view showing an example of a semiconductor device of the present invention.

Embodiment modes of the present invention will be described below with reference to drawings. However, the present invention can be implemented in various different modes, and it is easily understood by those skilled in the art that various changes and modifications of the modes and details are possible, unless such changes and modifications depart from the content and the scope of the present invention. Therefore, the present invention is not construed as being limited to the description of the embodiment modes. It is to be noted that in the drawings of this specification, the same portion or a portion having the same function is denoted by the same reference numeral, and the repetitive explanation thereof may be omitted.

Embodiment Mode 1

This embodiment mode describes an example of a semiconductor device of the present invention with reference to the drawings. In the description below, FIG. 1 shows a top surface of a semiconductor device and FIG. 2 is a cross-sectional view taken along line $A_1$-$B_1$ of FIG. 1.

Figure 2:
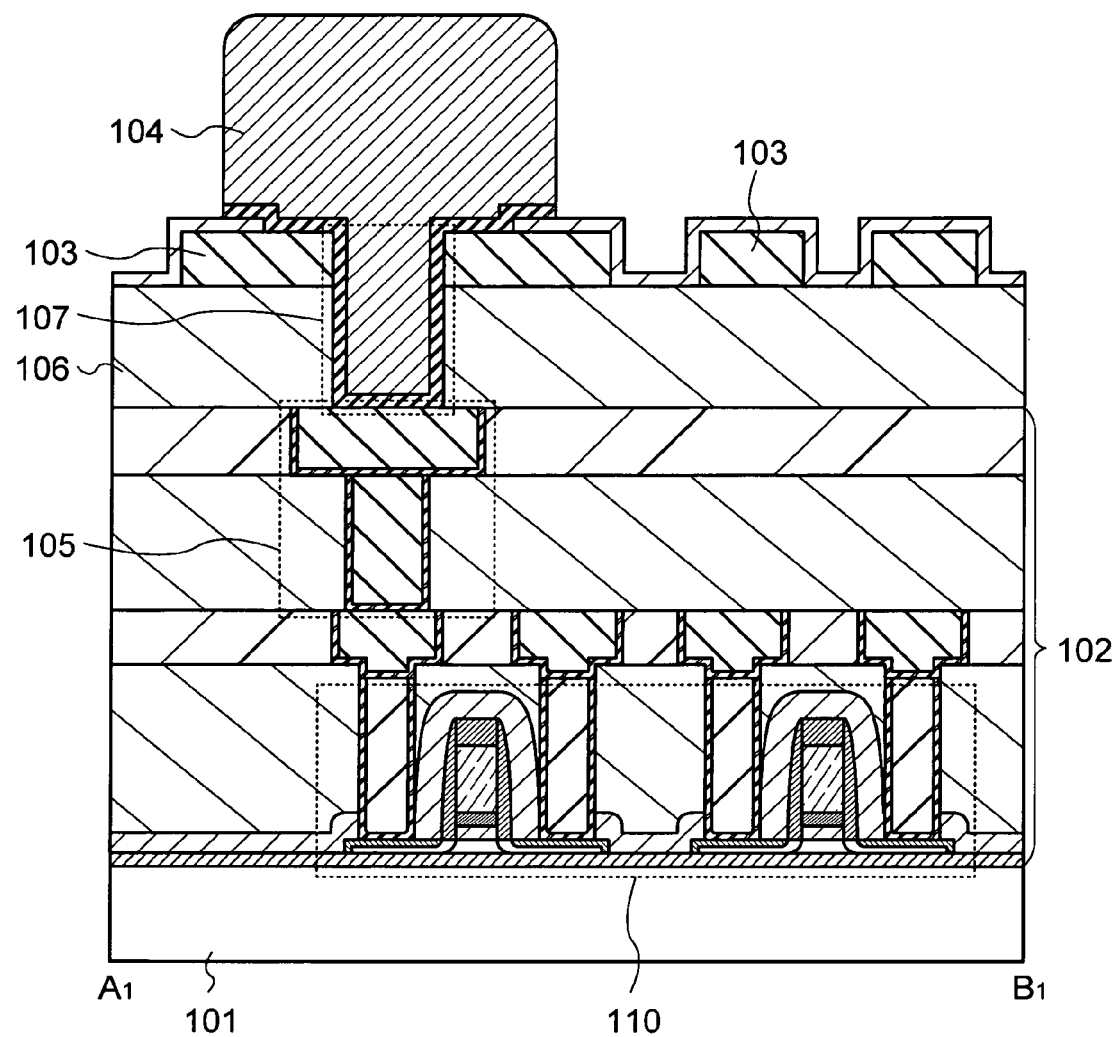
FIG. 2 is a cross-sectional view showing an example of a semiconductor device of the present invention.

A semiconductor device described in this embodiment mode includes an integrated circuit portion 102 which is provided over a substrate 101, a conductive film 103 serving as an antenna, and a conductive film 104 which electrically connects the integrated circuit portion 102 and the conductive film 103 (see FIGS. 1 and 2).

The conductive film 103 serving as an antenna is provided above the integrated circuit portion 102 with an insulating film 106 interposed therebetween, and the integrated circuit portion 102 and the conductive film 103 can partly or entirely overlap with each other. The integrated circuit portion 102 and the conductive film 103 serving as an antenna are electrically connected to each other by the conductive film 104 through an opening 107 formed in the insulating film 106 and the conductive film 103. That is, the conductive film 104 can serve as a contact conductive film which electrically connects the integrated circuit portion 102 and the conductive film 103. It is to be noted that the semiconductor device described in this embodiment mode has a structure in which a conductive film serving as an antenna is directly formed over an integrated circuit portion (on-chip antenna).

The integrated circuit portion 102 can be provided with an element 110 such as a transistor, a conductive film 105 which can serve as a wiring, and the like.

The conductive film 104 is also formed over a top surface of the conductive film 103 near the opening 107. When the conductive film 104 is formed in contact with a side surface and the top surface of the conductive film 103 in such a manner, an area is enlarged where the conductive film 104 and the conductive film 103 are in contact with each other. Accordingly, poor contact between the conductive film 103 serving as an antenna and the integrated circuit portion 102 or contact resistance therebetween can be reduced.

The conductive film 104 is preferably formed by a plating process. Formation of the conductive film 104 by a plating process makes it possible to sufficiently provide the conductive film 104 up to the bottom of the opening 107 even in the case where the opening 107 is deeply provided due to a multilayer or the like of the integrated circuit portion 102. As a result, poor connection between the conductive film 104 and the conductive film 105 can be suppressed and contact resistance therebetween can be reduced.

In general, in the case where the opening 107 is formed, and then, the conductive film 103 serving as an antenna is formed by a CVD method, a sputtering method, a screen printing method, a droplet discharge method, or the like and electrically and directly connected to the integrated circuit portion 102, there is a concern that the conductive film may be insufficiently formed in the bottom portion of the opening 107, resulting in poor connection or increase in contact resistance. However, when the integrated circuit portion 102 and the conductive film 103 serving as an antenna are formed, and then, the opening 107 is provided and the conductive film 105 serving as a contact conductive film is formed by a plating process, poor connection between the conductive film 103 and the integrated circuit portion 102 can be suppressed and contact resistance therebetween can be reduced.

In specific, the conductive film 104 can be provided by a plating process to have a single layer structure or a stacked structure using an element selected from copper (Cu), nickel (Ni), gold (Au), platinum (Pt), silver (Ag), cobalt (Co), or tin (Sn), or an alloy material or a compound material including any of these elements as its main component.

Figure 3:
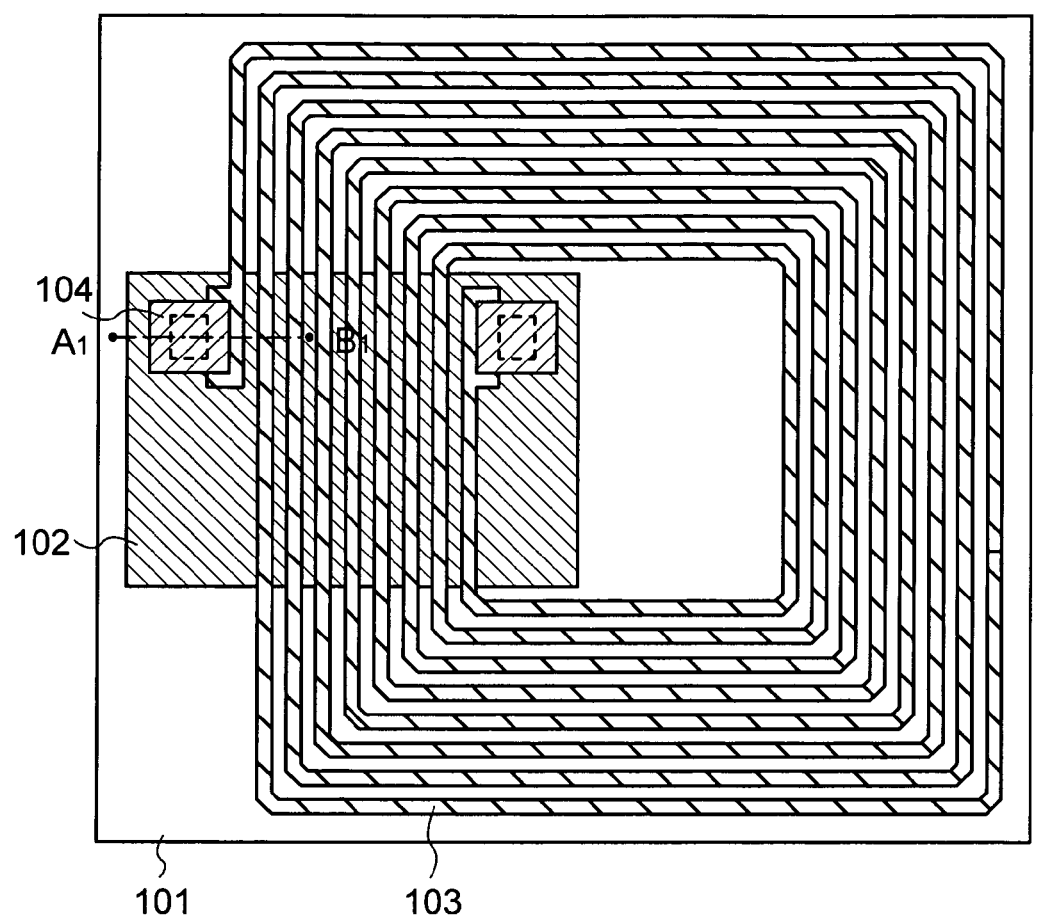
FIG. 3 is a top view showing an example of a semiconductor device of the present invention.
Figure 4:
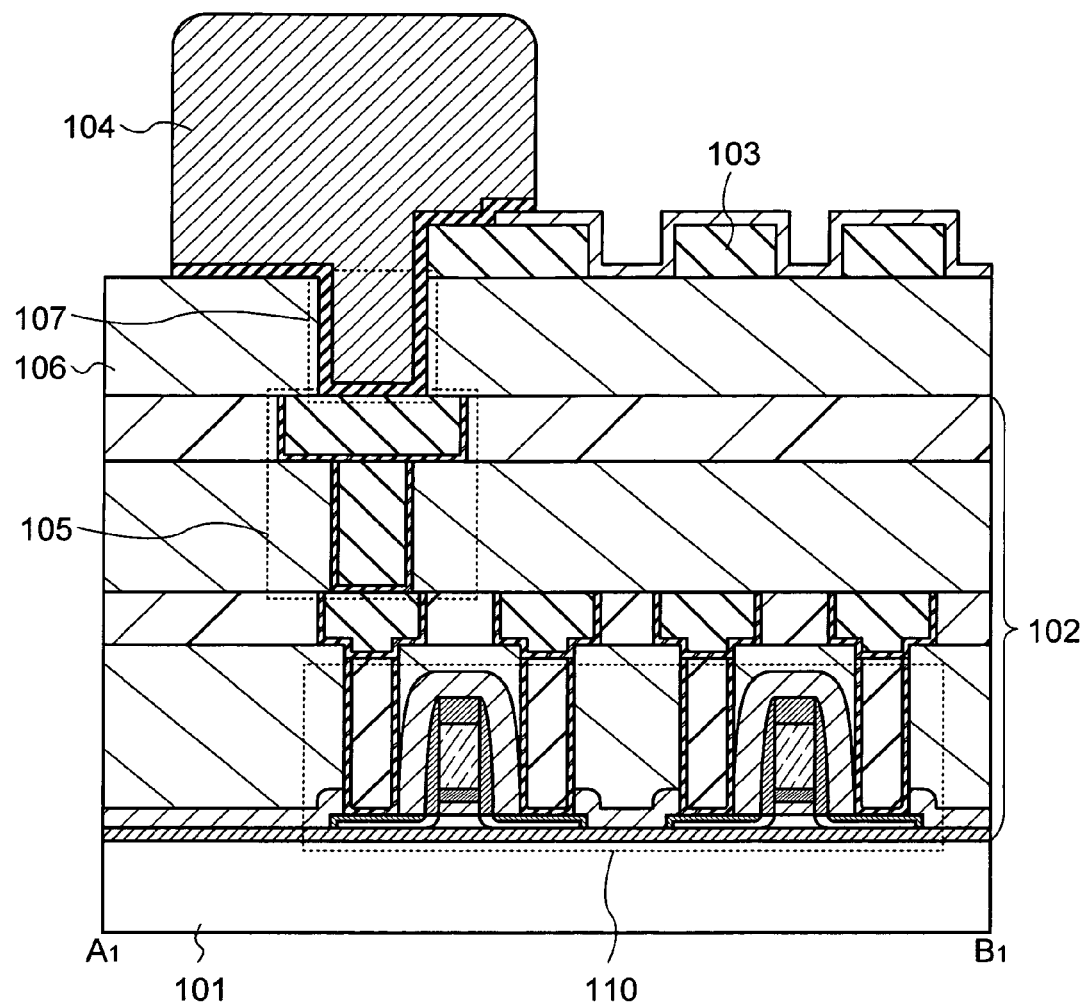
FIG. 4 is a cross-sectional view showing an example of a semiconductor device of the present invention.

Although the semiconductor device shown in FIGS. 1 and 2 has a structure in which the opening 107 is formed in the conductive film 103 serving as an antenna and the insulating film 106, the semiconductor device described in this embodiment mode is not limited thereto. For example, a structure may be used in which the conductive film 103 serving as an antenna is formed and then the opening 107 is formed in the insulating film 106 but not in the conductive film 103 serving as an antenna (see FIGS. 3 and 4). In this case, the conductive film 104 is provided so as to be in contact with the top surface and the side surface of the conductive film 103 serving as an antenna, whereby poor contact or contact resistance can be reduced.

The semiconductor device described in this embodiment mode may have a structure in which a booster antenna is provided so as to overlap with the conductive film 103 serving as an antenna. By provision of a booster antenna, reduction of a communication distance can be suppressed even in the case where the conductive film 103 is formed small.

Next, a method for manufacturing the above-described semiconductor device is described below with reference to the drawings.

Figure 5A:
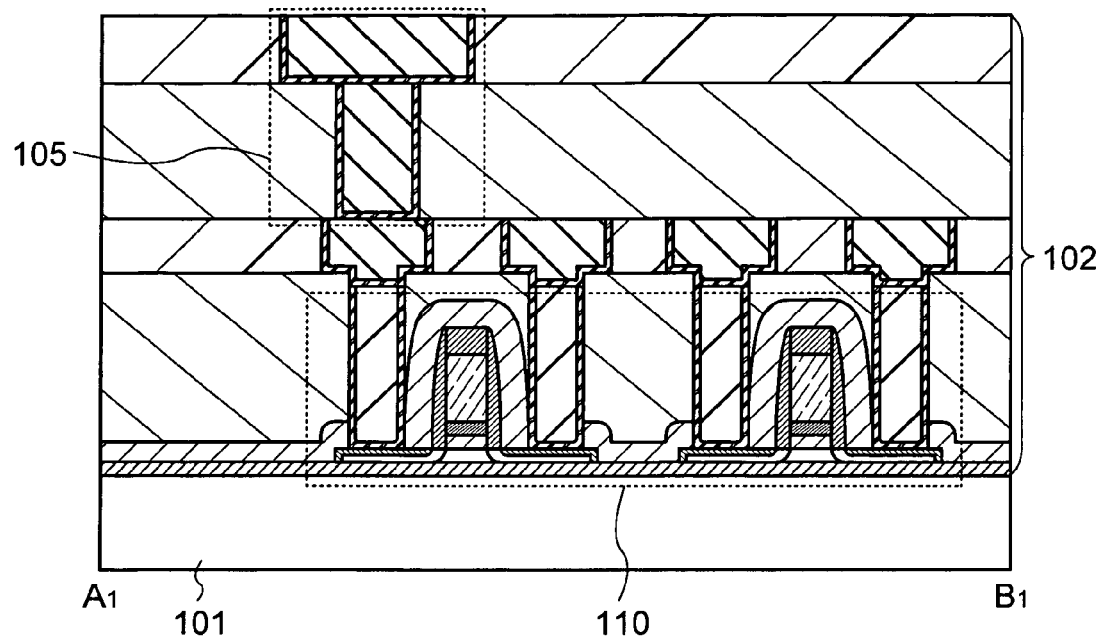
FIGS. 5A and 5B are cross-sectional views showing an example of a method for manufacturing a semiconductor device of the present invention.

First, the integrated circuit portion 102 provided with the element 110 which includes a transistor or the like and the conductive film 105 which can serve as a wiring is formed over the substrate 101 (see FIG. 5A).

As the substrate 101, for example, a single-crystal substrate, an SOI substrate, a glass substrate, a quartz substrate, a metal substrate, a stainless steel substrate, a plastic substrate, or the like can be used.

As the transistor provided in the integrated circuit portion 102, various types of transistors can be used. For example, a thin film transistor (TFT) using a non-single-crystal semiconductor film typified by amorphous silicon or polycrystalline silicon, a transistor formed using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or the like can be used. It is to be noted that a non-single-crystal semiconductor film may include hydrogen or halogen.

In addition, a transistor can have various structures without limitation to a certain structure. For example, a multi-gate structure which has two or more gates may be employed. With a multi-gate structure, off-current can be reduced and withstand voltage of the transistor can be increased, so that the reliability is improved, and drain-source current does not greatly changes even when drain-source voltage changes in a saturation region; thus, flat characteristics can be realized. Further, an LDD region may be provided. With an LDD region, off-current can be reduced and withstand voltage of the transistor can be increased, so that the reliability is improved, and drain-source current does not greatly change even when drain-source voltage changes in a saturation region; thus, flat characteristics can be realized.

Figure 5B:
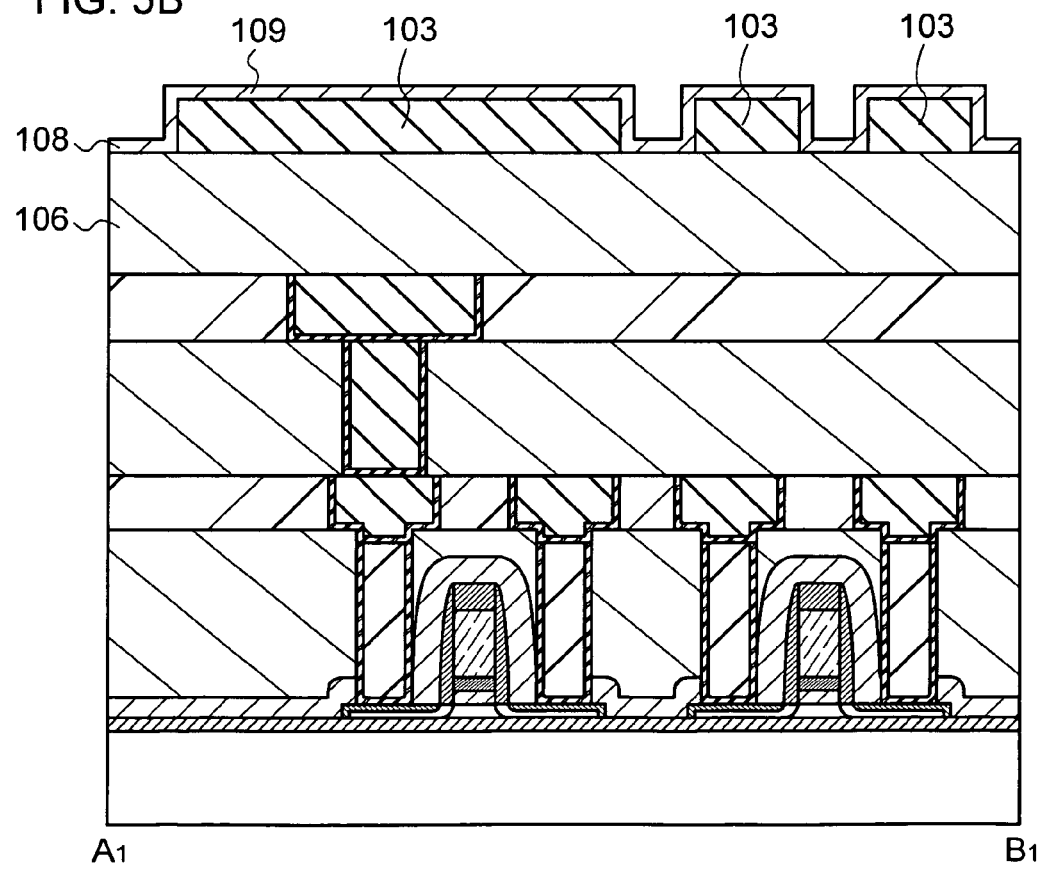

Next, the insulating film 106 is formed to cover the integrated circuit portion 102, and the conductive film 103 is selectively formed over the insulating film 106. Then, an insulating film 109 is formed to cover the conductive film 103 (see FIG. 5B). The conductive film 103 serves as an antenna in the semiconductor device.

The insulating films 106 and 109 are formed in a single layer or stacked layers using an inorganic material such as an oxide of silicon, a nitride of silicon, or the like (for example, silicon oxide ($SiO_x$), silicon oxynitride ($SiO_xN_y$, where x>y), silicon nitride ($SiN_x$), silicon nitride oxide ($SiN_xO_y$, where x>y), or the like); an organic material such as polyimide, polyamide, benzocyclobutene, acrylic, or epoxy; a siloxane material; or the like by a CVD method, a sputtering method, an SOG method, a droplet discharge method, a screen printing method, or the like. The insulating films 106 and 109 may be formed from the same material or different materials. It is to be noted that a siloxane material corresponds to a material having a Si—O—Si bond. Siloxane has a skeleton structure including a bond of silicon (Si) and oxygen (O). Siloxane includes an organic group containing at least hydrogen (such as an alkyl group or aromatic hydrocarbon) as a substituent. Alternatively, siloxane may include a fluoro group as a substituent. Further alternatively, siloxane may include both an organic group containing at least hydrogen and a fluoro group as a substituent.

The conductive film 103 is formed from a conductive material by a CVD method, a sputtering method, a printing method such as screen printing or gravure printing, a droplet discharge method, a plating process, or the like. The conductive film 103 is formed to have a single layer structure or a stacked structure using an element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material including any of these elements as its main component.

For example, in the case of forming the conductive film 103 serving as an antenna by a screen printing method, the conductive film can be provided by selectively printing a conductive paste in which conductive particles each having a grain diameter of several nanometers to several tens of micrometers are dissolved or dispersed in an organic resin. As the conductive particles, particles of one or more metals such as silver (Ag), gold (Au), copper (Cu), nickel (Ni), platinum (Pt), palladium (Pd), tantalum (Ta), molybdenum (Mo), or titanium (Ti); fine particles of silver halide; or dispersive nanoparticles can be used. When the conductive film 103 is formed by a screen printing method, the steps can be simplified and the cost can be reduced.

Next, the insulating film 106, the conductive film 103, and the insulating film 109 are partly and selectively removed to form the opening 107 (see FIG. 6A). The opening 107 is provided so that at least part of the conductive film 105 provided in the integrated circuit portion 102 is exposed. Further, the insulating film 109 is etched so that the top surface of the conductive film 103 near the opening 107 is exposed.

A seed layer 111 is formed on a surface of the opening 107 and the conductive film 103 (see FIG. 6B).

The seed layer can be formed from copper (Cu), nickel (Ni), chromium (Cr), or the like by a sputtering method, a CVD method, or the like. Before the formation of the seed layer 111, tantalum (Ta), tantalum nitride, titanium (Ti), titanium nitride, or the like may be formed in advance as a barrier layer. Alternatively, copper (Cu) may be formed by an electroless plating process after roughening treatment is performed on an exposed surface of the insulating film 106, the insulating film 109, and the like to form unevenness on the surface.

Figure 7:
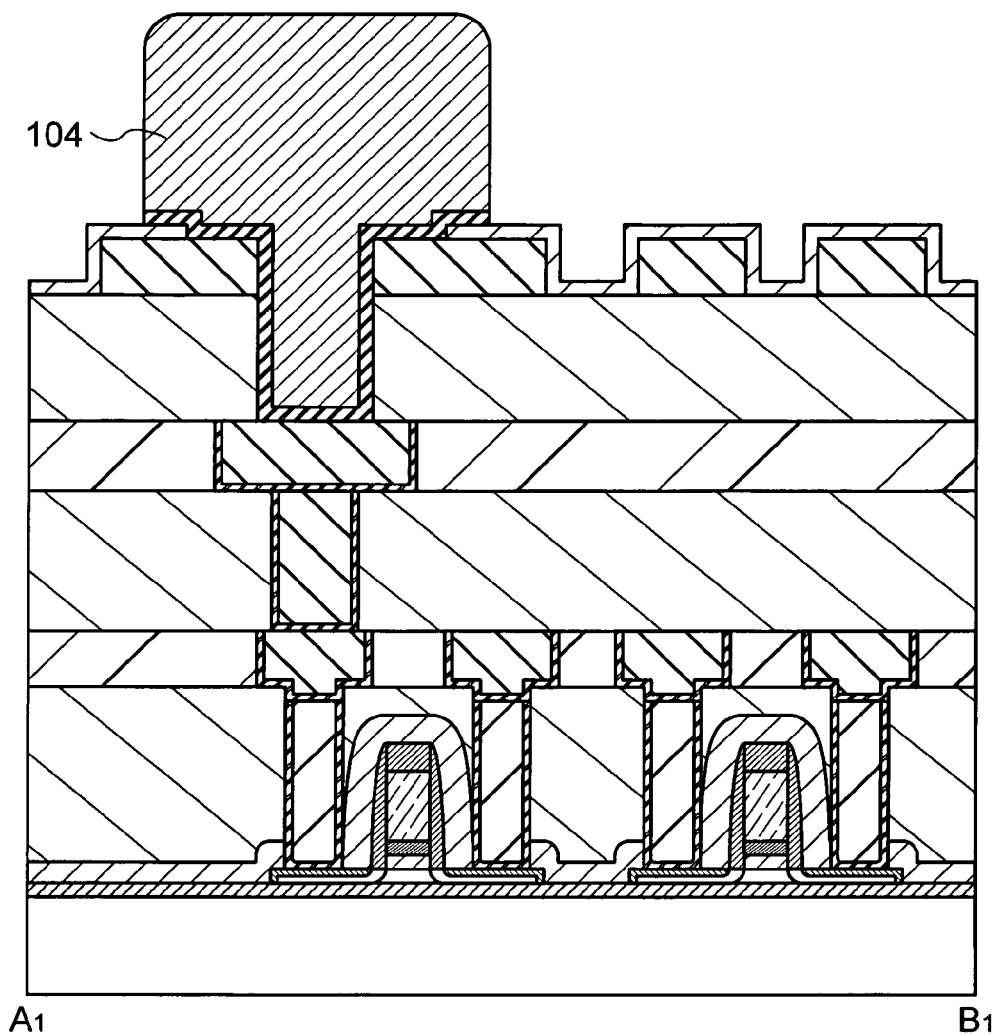
FIG. 7 is a cross-sectional view showing an example of a method for manufacturing a semiconductor device of the present invention.

The conductive film 104 is selectively formed in the opening 107 and over the top surface of the conductive film 103 near the opening 107 (see FIG. 7). As a result, the integrated circuit portion 102 and the conductive film 103 serving as an antenna are electrically connected to each other through the conductive film 104.

The conductive film 104 is formed by a plating process to have a single layer structure or a stacked structure using an element selected from copper (Cu), nickel (Ni), gold (Au), platinum (Pt), silver (Ag), cobalt (Co), or tin (Sn), or an alloy material or a compound material containing any of these elements as its main component. In specific, after a conductive film is formed over the seed layer 111 by a plating process, the conductive film and the seed layer are selectively removed, whereby the conductive film 104 to be a contact conductive film is formed.

When the conductive film 104 is provided by a plating process, the conductive film 104 can be sufficiently provided up to the bottom of the opening 107, whereby poor connection between the conductive film 104 and the conductive film 105 can be suppressed and contact resistance therebetween can be reduced.

In the method for manufacturing the semiconductor device described in this embodiment mode, the conductive film 104 may be formed by an additive method or a semi-additive method.

As described in this embodiment mode, after a conductive film serving as an antenna is provided over an integrated circuit portion with an insulating film interposed therebetween, an opening is provided in the insulating film and the conductive film serving as an antenna, and a contact conductive film is formed in the opening and over a top surface of the conductive film serving as an antenna to electrically connect the integrated circuit portion and the conductive film serving as an antenna. Accordingly, poor contact between the integrated circuit portion and the conductive film serving as an antenna can be suppressed and contact resistance therebetween can be reduced. Further, even in the case where the opening is deep, poor connection can be suppressed by formation of the contact conductive film by a plating process.

This embodiment mode can be implemented by being freely combined with the structure of the semiconductor device described in any of other embodiment modes in this specification.

Embodiment Mode 2

This embodiment mode describes a semiconductor device having a structure different from that described in the above embodiment mode, with reference to the drawings.

Figure 8:
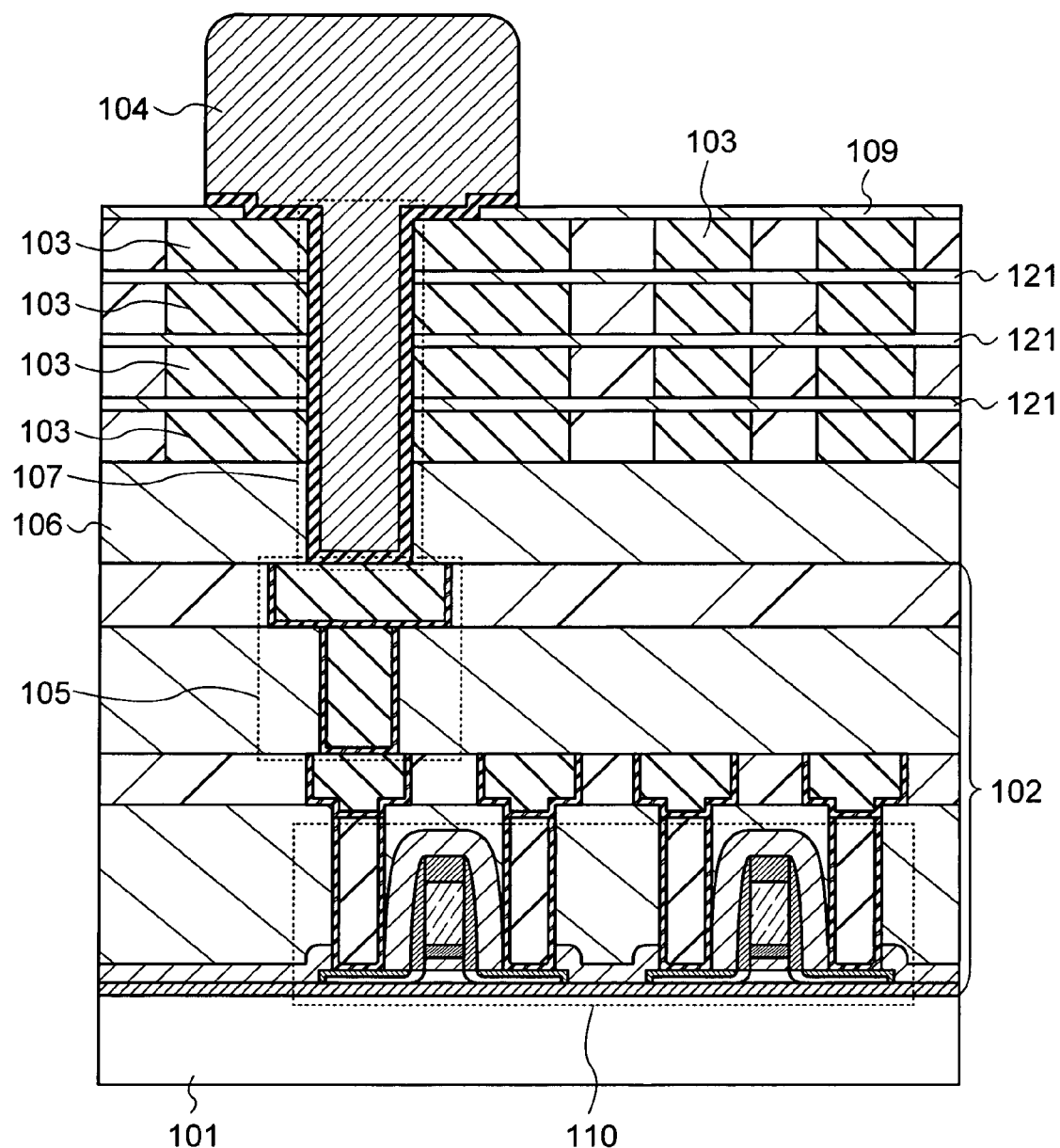
FIG. 8 is a cross-sectional view showing an example of a semiconductor device of the present invention.

A semiconductor device described in this embodiment mode includes an integrated circuit portion 102 which is provided over a substrate 101, a plurality of conductive films 103 serving as an antenna, and a conductive film 104 which electrically connects the integrated circuit portion 102 and the conductive film 103 (see FIG. 8). The plurality of conductive films 103 serving as an antenna is stacked over each other with an insulating film 121 alternately interposed therebetween, and each of the plurality of conductive films 103 is electrically connected to the conductive film 104. That is, the structure shown in FIG. 8 is different from that shown in FIG. 2 in that the plurality of conductive films 103 is provided to have a stacked structure.

The insulating film 121 is formed in a single layer or stacked layers using an inorganic material such as an oxide of silicon or a nitride of silicon (for example, silicon oxide, silicon oxynitride, silicon nitride, silicon nitride oxide, or the like); an organic material such as polyimide, polyamide, benzocyclobutene, acrylic, or epoxy; a siloxane material; or the like by a CVD method, a sputtering method, an SOG method, a droplet discharge method, a screen printing method, or the like.

The insulating film 121 may be formed by subjecting the conductive film 103 to one of or both oxidation treatment and nitridation treatment. For example, in the case of using aluminum (Al) as the conductive film 103, the insulating film 121 can be provided using aluminum oxide ($AlO_x$) or aluminum nitride ($AlN_x$) by subjecting the aluminum to oxidation or nitridation. The insulating film 121 and the insulating film 109 may be provided using the same material.

When the plurality of conductive films 103 serving as an antenna is stacked over each other in such a manner, the influence of a skin effect can be reduced. That is, in the case where the conductive film 103 serving as an antenna is provided to be thick to decrease resistance of the conductive film 103, current flowing through the conductive film 103 concentrates onto a surface of the conductive film 103 by a skin effect, and thus, resistance cannot be sufficiently reduced. However, with the structure in which the conductive films 103 serving as an antenna are stacked over each other with the insulating film 121 alternately interposed therebetween, current flows in a surface of each of a plurality of conductive films 103, and thus, the influence of a skin effect can be reduced.

Further, even in the case where the plurality of conductive films 103 is stacked over each other, poor connection between the conductive film 103 and the conductive film 105 can be suppressed and contact resistance therebetween can be reduced by provision of an opening 107 in an insulating film 106, the conductive film 103, and the insulating film 121 and provision of the conductive film 104 which can serve as a contact conductive film in the opening 107. Furthermore, after the plurality of conductive films 103 is provided, the integrated circuit portion 102 and the plurality of conductive films 103 are electrically connected to each other with the use of the conductive film 104 in one step, and accordingly, the steps can be simplified.

In the case where the plurality of conductive films 103 is stacked over each other, the opening 107 is deeply formed; however, by provision of the conductive film 104 by a plating process, the conductive film 104 can be sufficiently provided up to the bottom of the opening 107. As a result, even in the case where the plurality of conductive films 103 serving as an antenna is stacked over each other, poor connection between the conductive film 104 and the conductive film 105 can be suppressed and contact resistance therebetween can be reduced.

The above-described structure of a semiconductor device uses an electromagnetic induction method in which the conductive film 103 serving as an antenna is formed into a coil shape; however, the structure of a semiconductor device is not limited thereto. The conductive film 103 serving as an antenna can be formed into various shapes.

Figure 9A:
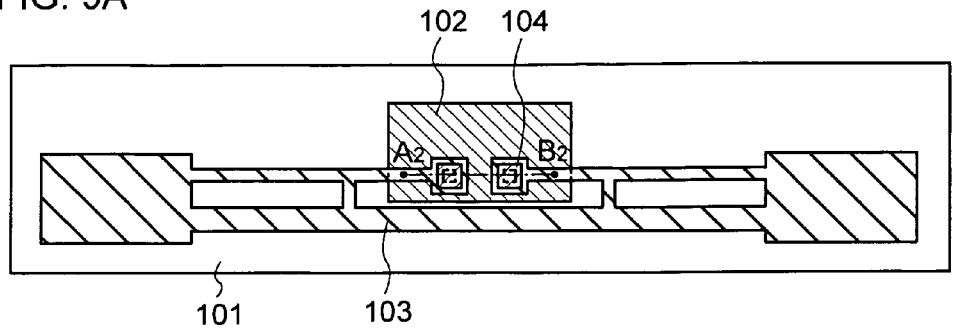
FIGS. 9A and 9B are a top view and a cross-sectional view showing an example of a semiconductor device of the present invention.
Figure 9B:
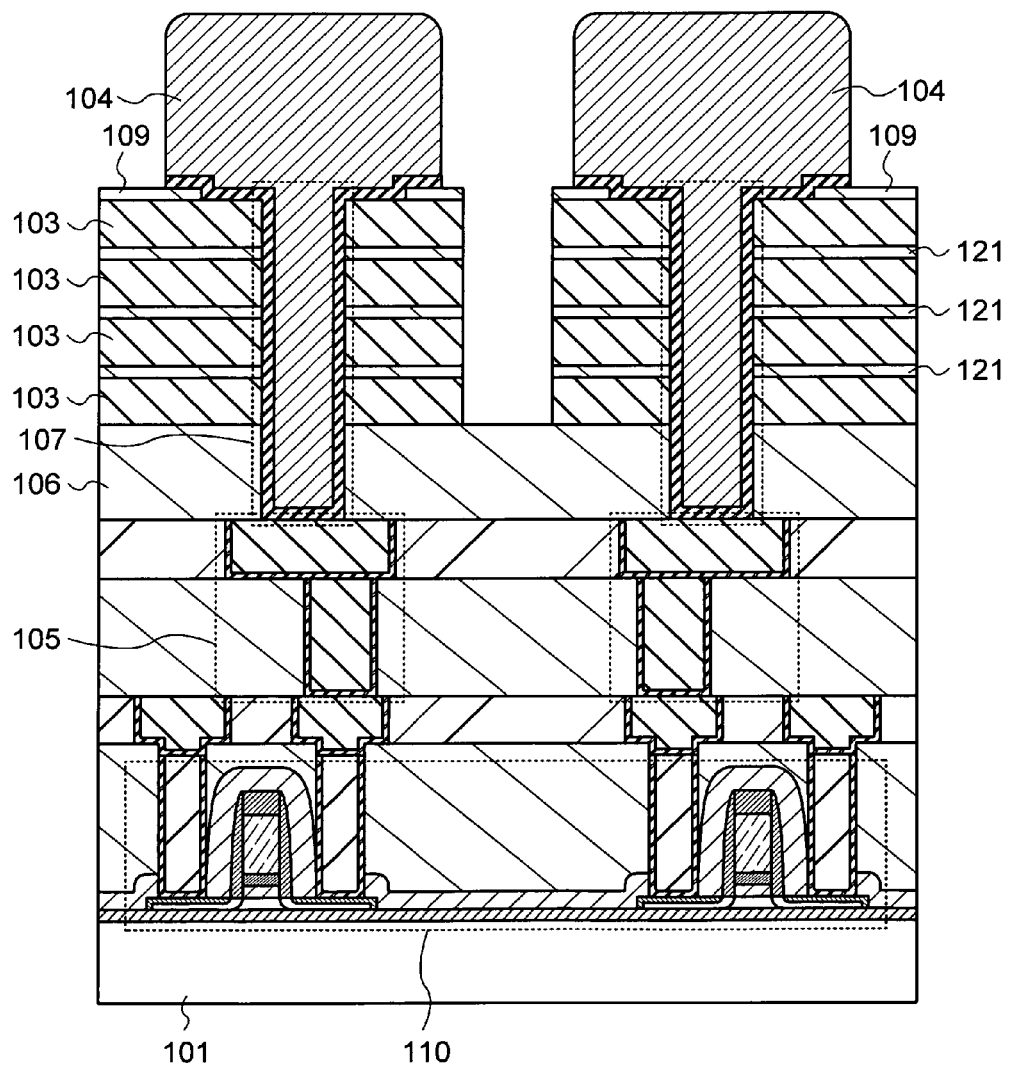

For example, the conductive film 103 serving as an antenna may be formed into a linear shape (see FIGS. 9A and 9B). As described herein, the structure described in this embodiment mode or the above-described embodiment mode can be used without depending on the shape of the antenna. FIG. 9A shows a top surface of a semiconductor device and FIG. 9B is a cross-sectional view taken along line $A_2$-$B_2$ of FIG. 9A.

This embodiment mode can be implemented by being freely combined with the structure of the semiconductor device or a method for manufacturing the semiconductor device described in any of other embodiment modes in this specification.

Embodiment Mode 3

This embodiment mode describes an example of a method for manufacturing the semiconductor device described in the above embodiment mode, with reference to the drawings. This embodiment mode describes the case where an element and the like included in an integrated circuit portion of a semiconductor device are provided using thin film transistors over one substrate. Further, this embodiment mode describes the case where after an element such as a thin film transistor is provided over a supporting substrate, the element is transferred to a flexible substrate so that a semiconductor device is manufactured. Furthermore, this embodiment mode describes the case where a plurality of integrated circuit portions and antennas is formed over one substrate (here, longitudinal 4×lateral 3) so that a plurality of semiconductor devices is manufactured. In the description below, FIGS. 12A to 13C are schematic top views and FIGS. 14A to 18B are schematic cross-sectional views taken along line A-B of FIGS. 12A to 13C.

Figure 12A:
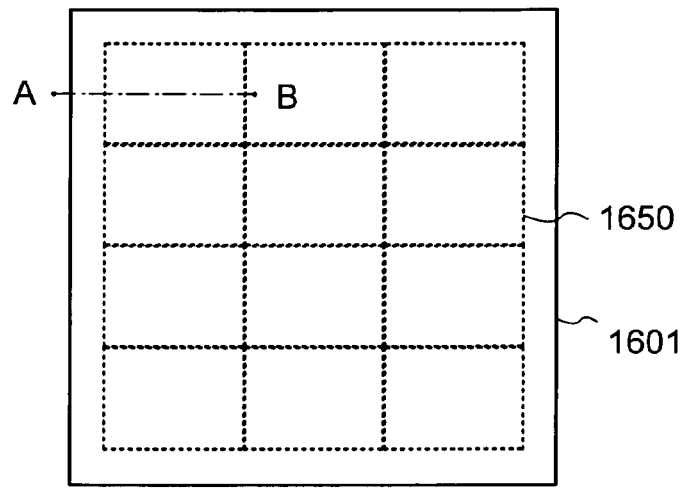
FIGS. 12A to 12C are top views showing an example of a method for manufacturing a semiconductor device of the present invention.
Figure 12B:
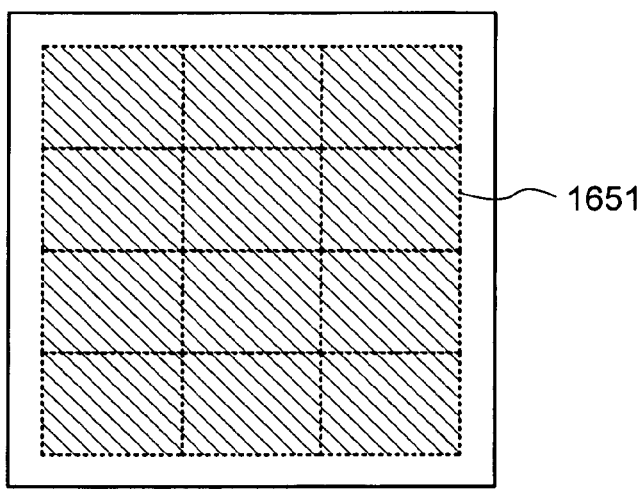

First, a separation layer 1602 is formed over one surface of a substrate 1601, and sequentially, an insulating film 1603 serving as a base and an amorphous semiconductor film 1604 (for example, a film including amorphous silicon) are formed (FIGS. 12A and 14A). The separation layer 1602, the insulating film 1603, and the amorphous semiconductor film 1604 can be successively formed. Since the separation layer 1602, the insulating film 1603, and the amorphous semiconductor film 1604 are not exposed to the air owing to the successive formation, contamination of impurities can be prevented. In steps described below, an integrated circuit portion and an antenna which form a semiconductor device are each formed in a plurality of regions 1650 shown in FIG. 12A.

As the substrate 1601, a glass substrate, a quartz substrate, a metal substrate, a stainless steel substrate, a plastic substrate having heat resistance against a processing temperature of this process, or the like may be used. Such a substrate has no particular limitation on its area and shape. Therefore, for example, a rectangular substrate having a side of 1 meter or longer can be used as the substrate 1601, whereby the productivity can be drastically improved. Such merit is greatly advantageous as compared to the case of using a circular silicon substrate. Accordingly, even in the case where an integrated circuit portion and an antenna are formed to be larger in comparison to the case of using a silicon substrate, cost reduction can be achieved.

It is to be noted that the separation layer 1602 is provided over an entire surface of the substrate 1601 in this step; however, in accordance with need, the separation layer 1602 may be selectively provided by a photolithography method after being formed over an entire surface of the substrate 1601. Further, although the separation layer 1602 is formed in contact with the substrate 1601, in accordance with need, an insulating film such as a silicon oxide ($SiO_x$) film, a silicon oxynitride ($SiO_xN_y$) (x>y) film, a silicon nitride ($SiN_x$) film, or a silicon nitride oxide ($SiN_xO_y$) (x>y) film may be formed and the separation layer 1602 may be formed in contact with the insulating film.

The separation layer 1602 can be formed using a metal film, a stacked structure of a metal film and a metal oxide film, or the like. The metal film is formed in a single layer or stacked layers using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir), or an alloy material or a compound material containing any of these elements as its main component. These materials can be deposited by a sputtering method; various CVD methods such as a plasma CVD method; or the like. As a stacked structure of a metal film and a metal oxide film, an oxide or an oxynitride of the metal film can be provided over a surface of the metal film by plasma treatment under an oxygen atmosphere or an $N_2O$ atmosphere or heat treatment under an oxygen atmosphere or an $N_2O$ atmosphere which is performed after the above-described metal film is formed. Alternatively, an oxide or an oxynitride of the metal film can be provided over a surface of the metal film by treating the surface of the metal film by a solution having strong oxidizing power such as ozone water after the formation of the metal film.

The insulating film 1603 is formed in a single layer or stacked layers using a film containing an oxide of silicon or a nitride of silicon by a sputtering method, a plasma CVD method, or the like. In the case where the insulating film serving as a base is formed to have a two-layer structure, for example, a silicon nitride oxide film and a silicon oxynitride film may be formed as a first layer and a second layer, respectively. In the case where the insulating film serving as a base is formed to have a three-layer structure, a silicon oxide film, a silicon nitride oxide film, and a silicon oxynitride film may be formed as a first insulating film, a second insulating film, and a third insulating film, respectively. Alternatively, a silicon oxynitride film, a silicon nitride oxide film, and a silicon oxynitride film may be formed as the first insulating film, the second insulating film, and the third insulating film, respectively. The insulating film serving as a base works as a blocking film which prevents intrusion of impurities from the substrate 1601.

The semiconductor film 1604 may be formed to a thickness of 25 to 200 nm (preferably 30 to 150 nm) by a sputtering method, an LPCVD method, a plasma CVD method, or the like. As the semiconductor film 1604, an amorphous silicon film may be formed, for example.

The amorphous semiconductor film 1604 is crystallized by irradiation with laser light. The amorphous semiconductor film 1604 may be crystallized by a method of combining laser light irradiation and a thermal crystallization method using RTA or an annealing furnace or a thermal crystallization method using a metal element promoting crystallization, or the like. After that, the obtained crystalline semiconductor film is etched to have a desired shape, whereby semiconductor films 1604a to 1604d are formed. A gate insulating film 1605 is formed to cover the semiconductor films 1604a to 1604d (see FIG. 14B).

An example of manufacturing steps of the semiconductor films 1604a to 1604d is briefly described below. First, an amorphous semiconductor film (for example, an amorphous silicon film) with a thickness of 50 to 60 nm is formed by a plasma CVD method. A solution including nickel which is a metal element promoting crystallization is held over the amorphous semiconductor film, and then, the amorphous semiconductor film is subjected to dehydrogenation treatment (at 500° C. for one hour) and thermal crystallization treatment (at 550° C. for four hours) to form a crystalline semiconductor film. After that, laser light is emitted from a laser oscillator, so that the semiconductor films 1604a to 1604d are formed by a photolithography method. The amorphous semiconductor film may be crystallized only by laser light irradiation without thermal crystallization using a metal element promoting crystallization.

For a laser oscillator, either continuous wave laser beams (CW laser beams) or pulsed laser beams can be used. Laser beams that can be used here include those emitted from gas lasers such as an Ar laser, a Kr laser, and an excimer laser; a laser in which single crystal YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$, is doped with one or more laser media selected from Nd, Yb, Cr, Ti, Ho, Er, Tm, or Ta; a glass laser; a ruby laser; an alexandrite laser; a Ti:sapphire laser; a copper vapor laser; and a metal vapor laser. When irradiation is carried out with the fundamental wave of such laser beams or the second to fourth harmonics of the fundamental wave, crystals with a large grain diameter can be obtained. For example, the second harmonic (532 nm) or the third harmonic (355 nm) of an Nd:YVO$_4$ laser (a fundamental wave of 1064 nm) can be used. In this case, a laser power density of about 0.01 to 100 MW/cm$^2$ (preferably, 0.1 to 10 MW/cm$^2$) is needed, and irradiation is conducted with a scanning rate of about 10 to 2000 cm/sec. It is to be noted that the laser in which single-crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ is doped with one or more laser media selected from Nd, Yb, Cr, Ti, Ho, Er, Tm, or Ta as dopant; an Ar ion laser; or a Ti:sapphire laser can be used as a CW laser, whereas they can also be used as pulsed laser with a repetition rate of 10 MHz or more by being combined with a Q-switch operation or mode locking. When a laser beam with a repetition rate of 10 MHz or more is used, a semiconductor film is irradiated with the next pulse after it is melted by the previous laser and before it becomes solidified. Therefore, unlike the case of using a pulsed laser with a low repetition rate, a solid-liquid interface in the semiconductor film can be continuously moved. Thus, crystal grains that have grown continuously in the scanning direction can be obtained.

Next, the gate insulating film 1605 which covers the semiconductor films 1604a to 1604d is formed. The gate insulating film 1605 is formed in a single layer or stacked layers using a film containing an oxide of silicon or a nitride of silicon by a CVD method, a sputtering method, or the like. In specific, the gate insulating film 1605 is formed in a single layer or stacked layers of any of a silicon oxide film, a silicon oxynitride film, and a silicon nitride oxide film.

The gate insulating film 1605 may also be formed by subjecting the amorphous semiconductor films 1604a to 1604d to treatment using high-density plasma, so that surfaces thereof are oxidized or nitrided. For example, plasma treatment with a mixed gas of a rare gas such as He, Ar, Kr, or Xe, and oxygen, nitrogen oxide (NO$_2$), ammonia, nitrogen, or hydrogen is used. When plasma is excited by the introduction of microwaves, plasma with a low electron temperature and a high density can be produced. With oxygen radicals (which may also include OH radicals) or nitrogen radicals (which may also include NH radicals) that are produced by the high-density plasma, the surfaces of the semiconductor films can be oxidized or nitrided.

By such treatment using high-density plasma, an insulating film with a thickness of 1 to 20 nm, typically 5 to 10 nm, is formed over the semiconductor films. Since the reaction in this case is a solid-phase reaction, interface state density between the insulating film and the semiconductor films can be made quite low. Also, since such treatment using high-density plasma directly oxidizes (or nitrides) semiconductor films (crystalline silicon or polycrystalline silicon), variation in thickness of the insulating film to be formed can be greatly reduced, ideally. Further, since crystal grain boundaries of crystalline silicon are not strongly oxidized, an excellent state can be obtained. That is, by the solid-phase oxidation of the surfaces of the semiconductor films through the treatment using high-density plasma described in this embodiment mode, an insulating film with favorable uniformity and low interface state density can be formed without excessive oxidation at the crystal grain boundaries.

As the gate insulating film 1605, only an insulating film formed by treatment using high-density plasma may be used, or it is also possible to deposit another insulating film of, for example, silicon oxide, silicon oxynitride, or silicon nitride over the above-mentioned insulating film by a CVD method using plasma or thermal reaction. In any case, variation in characteristics of a transistor, which has an insulating film formed by treatment using high-density plasma in a part of or the entire gate insulating film, can be reduced.

The semiconductor films 1604a to 1604d which are obtained by crystallization of a semiconductor film by irradiation of a continuous wave laser light or a laser with a repetition rate of 10 MHz or more while scanning in one direction has a characteristic that crystals thereof grow in the scanning direction of the laser light. Therefore, a transistor is placed so that the scanning direction is aligned with the channel length direction (the flowing direction of carriers in a channel forming region), and then the foregoing gate insulating layer is combined. In this manner, a thin film transistor (TFT) with small variations in characteristics and high electron field-effect mobility can be realized.

Next, a first conductive film and a second conductive film are stacked over the gate insulating film 1605. Here, the first conductive film is formed to a thickness of 20 to 100 nm by a plasma CVD method, a sputtering method, or the like. The second conductive film is formed to a thickness of 100 to 400 nm. The first conductive film and the second conductive film are formed using an element selected from tantalum (Ta), tungsten (W), titanium (Ti), molybdenum (Mo), aluminum (Al), copper (Cu), chromium (Cr), niobium (Nb), or the like, or an alloy material or a compound material containing any of these elements as its main component. Alternatively, the first conductive film and the second conductive are formed using a semiconductor material typified by polycrystalline silicon doped with an impurity element such as phosphorus. As combination examples of the first conductive film and the second conductive film, a tantalum nitride film and a tungsten film; a tungsten nitride film and a tungsten film; a molybdenum nitride film and a molybdenum film; and the like can be given. Tungsten and tantalum nitride have high heat resistance. Therefore, after forming the first conductive film and the second conductive film using tungsten and tantalum nitride, heat treatment can be performed for the purpose of thermal activation. In addition, in the case where a three-layer structure is employed instead of a two-layer structure, it is preferable to form a stacked structure of a molybdenum film, an aluminum film, and a molybdenum film.

Next, a mask formed from resist is formed by a photolithography method, and etching treatment for forming gate electrodes and gate wirings is performed. Thus, gate electrodes 1607 are formed above the semiconductor films 1604a to 1604d.

Next, a mask formed from resist is formed by a photolithography method and the semiconductor films 1604a to 1604d are doped with an impurity element which imparts n-type conductivity by an ion doping method or an ion implantation method at a low concentration. As the impurity element which imparts n-type conductivity, an element belonging to Group 15 in the periodic table such as phosphorus (P) or arsenic (As) may be used.

Next, an insulating film is formed to cover the gate insulating film 1605 and the gate electrodes 1607. The insulating film is formed in a single layer or stacked layers using a film containing an inorganic material of silicon, an oxide of silicon, or a nitride of silicon, or a film containing an organic material such as an organic resin by a plasma CVD method, a sputtering method, or the like. Next, the insulating film is selectively etched by anisotropic etching in which etching is conducted mainly in the perpendicular direction, thus, insulating films 1608 (also called sidewalls) that are in contact with side surfaces of the gate electrodes 1607 are formed. The insulating films 1608 are used as doping masks for forming lightly doped drain (LDD) regions later.

Next, an impurity element which imparts n-type conductivity is added to the semiconductor films 1604a to 1604d using a mask formed from resist by a photolithography method and using the gate electrodes 1607 and the insulating films 1608 as masks. Thus, channel formation regions 1606a, first impurity regions 1606b, and second impurity regions 1606c are formed (see FIG. 14C). The first impurity region 1606b serves as a source region or a drain region of a thin film transistor, and the second impurity region 1606c serves as an LDD region. The concentration of the impurity element contained in the second impurity region 1606c is lower than the concentration of the impurity element contained in the first impurity region 1606b.

Next, an insulating film is formed in a single layer or stacked layers to cover the gate electrodes 1607, the insulating films 1608, and the like, and conductive films 1631 serving as source electrodes or drain electrodes of thin film transistors are formed over the insulating film. Accordingly, an element layer 1651 including thin film transistors 1630a to 1630d are obtained (see FIGS. 14D and 12B). It is to be noted that elements such as thin film transistors may be provided over an entire surface of the region 1650 or provided over a portion excluding part (for example, a center portion) of the region 1650.

The insulating film is formed in a single layer or stacked layers using an inorganic material such as an oxide of silicon or a nitride of silicon; an organic material such as polyimide, polyamide, benzocyclobutene, acrylic, or epoxy; a siloxane material; or the like by a CVD method, a sputtering method, an SOG method, a droplet discharge method, a screen printing method, or the like. This embodiment mode shows an example in which the insulating film is formed in two layers, and a silicon nitride oxide film and a silicon oxynitride film can be formed as a first insulating film 1609 and a second insulating film 1610, respectively.

It is to be noted that before the insulating films 1609 and 1610 are formed or after one or both of them is/are formed, heat treatment is preferably performed for recovery of the crystallinity of the semiconductor films 1604a to 1604d, activation of the impurity element that has been added to the semiconductor films, or hydrogenation of the semiconductor films. As the heat treatment, thermal annealing, a laser annealing method, an RTA method, or the like is preferably performed.

The insulating films 1609 and 1610 and the like are etched by a photolithography method, whereby contact holes that expose the first impurity regions 1606b are formed. Then, a conductive film is formed so as to fill the contact holes and the conductive film is selectively etched to form conductive films 1631. It is to be noted that before the conductive films are formed, a silicide may be formed over the surfaces of the semiconductor films 1604a to 1604d that are exposed by the contact holes.

The conductive films 1631 are each formed in a single layer or stacked layers using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing any of these elements as its main component by a CVD method, a sputtering method, or the like. An alloy material containing aluminum as its main component corresponds to, for example, a material which contains aluminum as its main component and also contains nickel, or an alloy material which contains aluminum as its main component and also contains nickel and one of or both carbon and silicon. The conductive films 1631 are each preferably formed to have a stacked structure of, for example, a barrier film, an aluminum-silicon (Al—Si) film, and a barrier film, or a barrier film, an aluminum-silicon (Al—Si) film, a titanium nitride film, and a barrier film. It is to be noted that "barrier film" corresponds to a thin film of titanium, a nitride of titanium, molybdenum, or a nitride of molybdenum. Aluminum and aluminum silicon which have low resistance and are inexpensive are the most suitable material for forming the conductive films 1631. When barrier layers are provided as the top layer and the bottom layer, generation of hillocks of aluminum or aluminum silicon can be prevented. Further, when a barrier film formed from titanium which is an element having a high reducing property is formed, even when there is a thin natural oxide film formed over the crystalline semiconductor film, the natural oxide film can be reduced, and a favorable contact between the conductive film 1631 and the crystalline semiconductor film can be obtained.

Figure 15A:
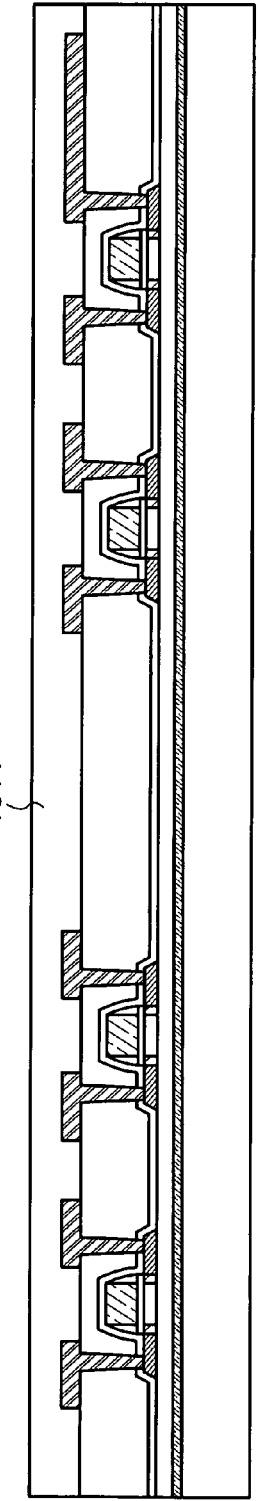
FIGS. 15A to 15C are cross-sectional views showing an example of a method for manufacturing a semiconductor device of the present invention.

Next, an insulating film 1611 is formed to cover the conductive films 1631 (see FIG. 15A). The insulating film 1611 is formed in a single layer or stacked layers using an inorganic material or an organic material by a CVD method, a sputtering method, an SOG method, a droplet discharge method, a screen printing method, or the like. Preferably, the insulating film 1611 is formed to a thickness of 0.75 to 3 μm.

Figure 12C:
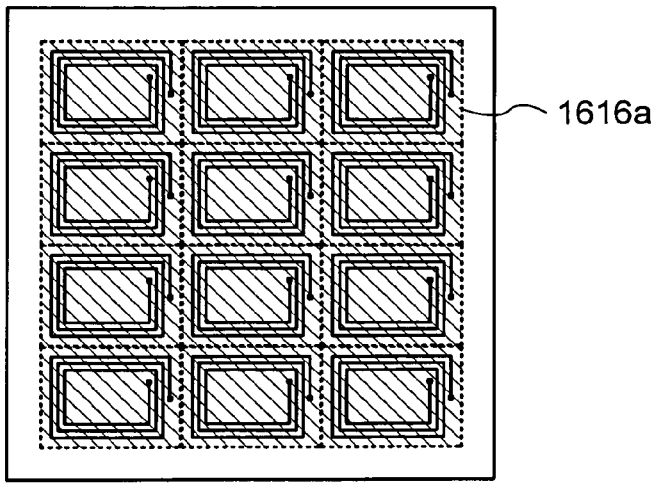
Figure 15B:
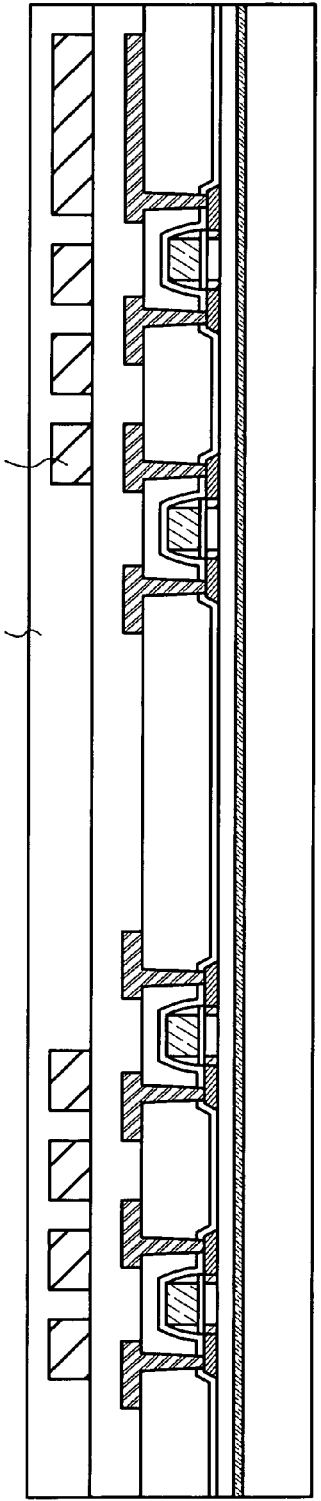

A conductive film 1612 serving as an antenna is selectively formed over a surface of the insulating film 1611, and an insulating film 1613 is formed to cover the conductive film 1612 (see FIGS. 15B and 12C).

The conductive film 1612 is formed from a conductive material by a CVD method, a sputtering method, a printing method such as screen printing or gravure printing, a plating process, or the like. The conductive film 1612 is formed to have a single layer structure or a stacked structure using an element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material including any of these elements as its main component.

For example, in the case of forming the conductive film 1612 serving as an antenna by a screen printing method, the conductive film can be provided by selectively printing a conductive paste in which conductive particles each having a grain diameter of several nanometers to several tens of micrometers are dissolved or dispersed in an organic resin. As the conductive particles, particles of one or more metals such as silver (Ag), gold (Au), copper (Cu), nickel (Ni), platinum (Pt), palladium (Pd), tantalum (Ta), molybdenum (Mo), or titanium (Ti); fine particles of silver halide; or dispersive nanoparticles can be used. When the conductive film 103 is formed by a screen printing method, the steps can be simplified and the cost can be reduced.

The insulating film 1613 is formed in a single layer or stacked layers using an inorganic material such as an oxide of silicon or a nitride of silicon (for example, silicon oxide, silicon oxynitride, silicon nitride, silicon nitride oxide, or the like); an organic material such as polyimide, polyamide, benzocyclobutene, acrylic, or epoxy; a siloxane material; or the like by a CVD method, a sputtering method, an SOG method, a droplet discharge method, a screen printing method, or the like.

Figure 15C:
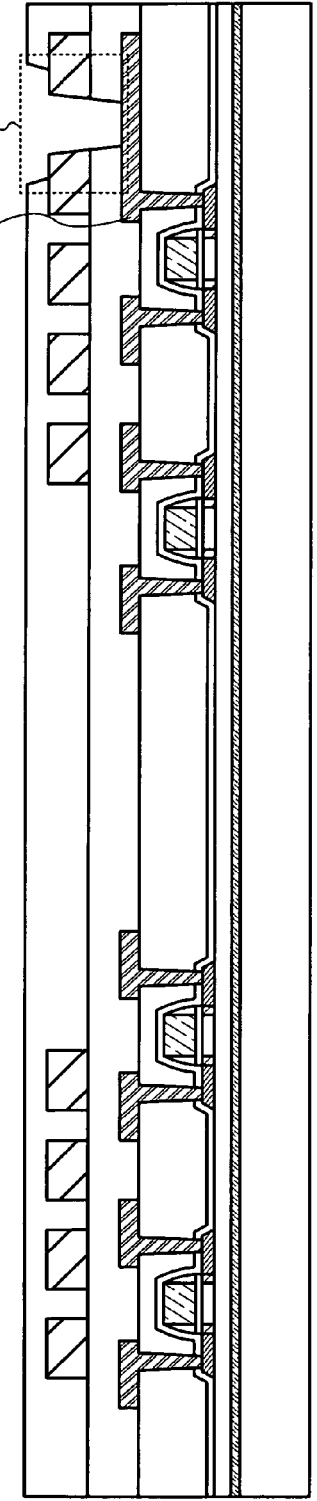

Next, an opening 1614 is selectively formed in the insulating film 1613, the conductive film 1612, and the insulating film 1611, so that a conductive film 1631 to be a source electrode or a drain electrode of the thin film transistor 1630d is exposed (see FIG. 15C).

Figure 16A:
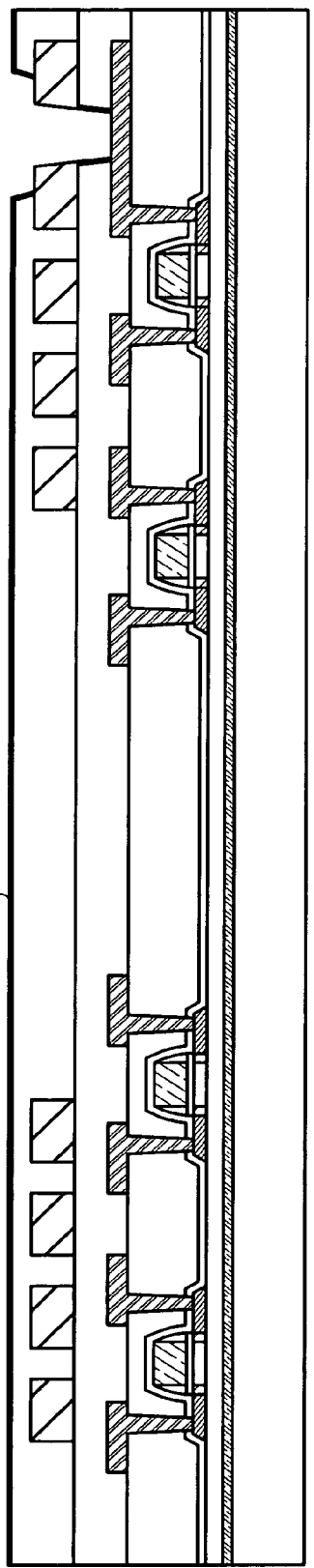
FIGS. 16A and 16B are cross-sectional views showing an example of a method for manufacturing a semiconductor device of the present invention.

A seed layer 1615 is formed on a surface of the insulating film 1613, a side surface of the insulating film 1611 in the opening 1614, and the like (FIG. 16A). The seed layer 1615 can be formed by performing roughening treatment on a surface of the insulating films 1613 and 1611 and then performing an electroless plating process. For example, the insulating films 1613 and 1611 may be chemically roughened to form unevenness on their surfaces, and then, copper (Cu) treatment may be performed by an electroless plating process.

Figure 16B:
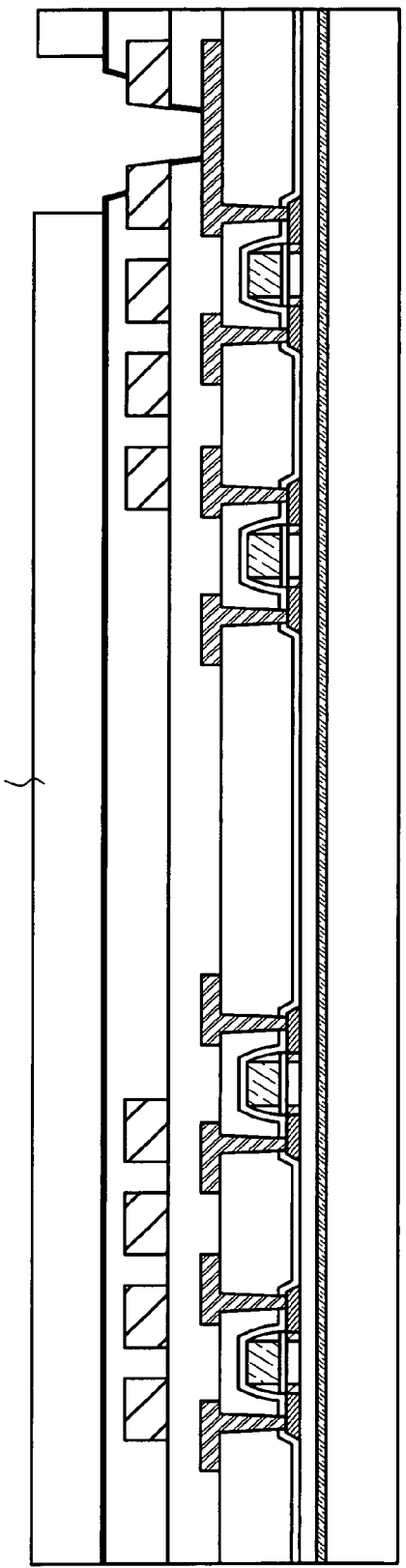

A resist 1616 is selectively formed over the seed layer 1615 (FIG. 16B).

Figure 17A:
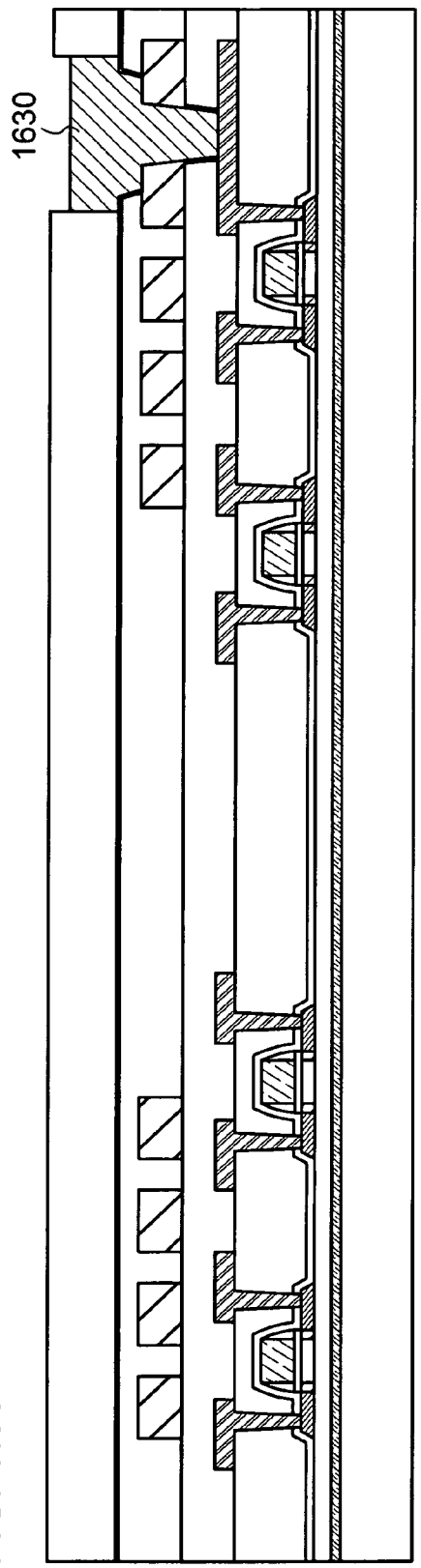
FIGS. 17A and 17B are cross-sectional views showing an example of a method for manufacturing a semiconductor device of the present invention.

A conductive film 1630 is formed over the seed layer 1615 which is not covered with the resist 1616 (FIG. 17A). The conductive film 1630 can be formed by a plating process, for example, an electrolytic plating process using copper (Cu). The conductive film 1630 can serve as a contact conductive film which electrically connects the conductive film 1612 and the conductive film 1631.

Then, an element formation layer including the thin film transistors, the conductive film 1612 serving as an antenna, and the like is separated from the substrate 1601.

Figure 13A:
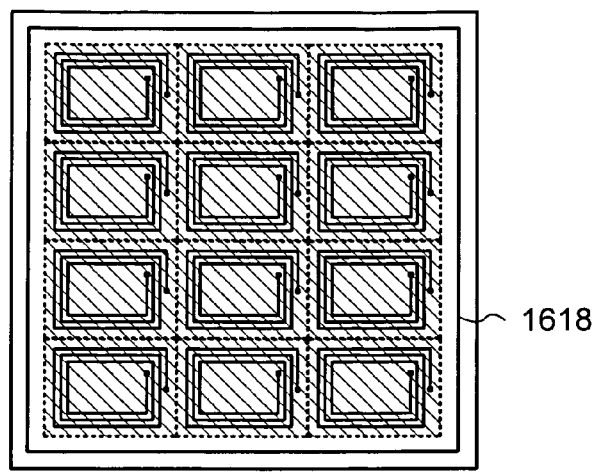
FIGS. 13A to 13C are top views showing an example of a method for manufacturing a semiconductor device of the present invention.
Figure 17B:
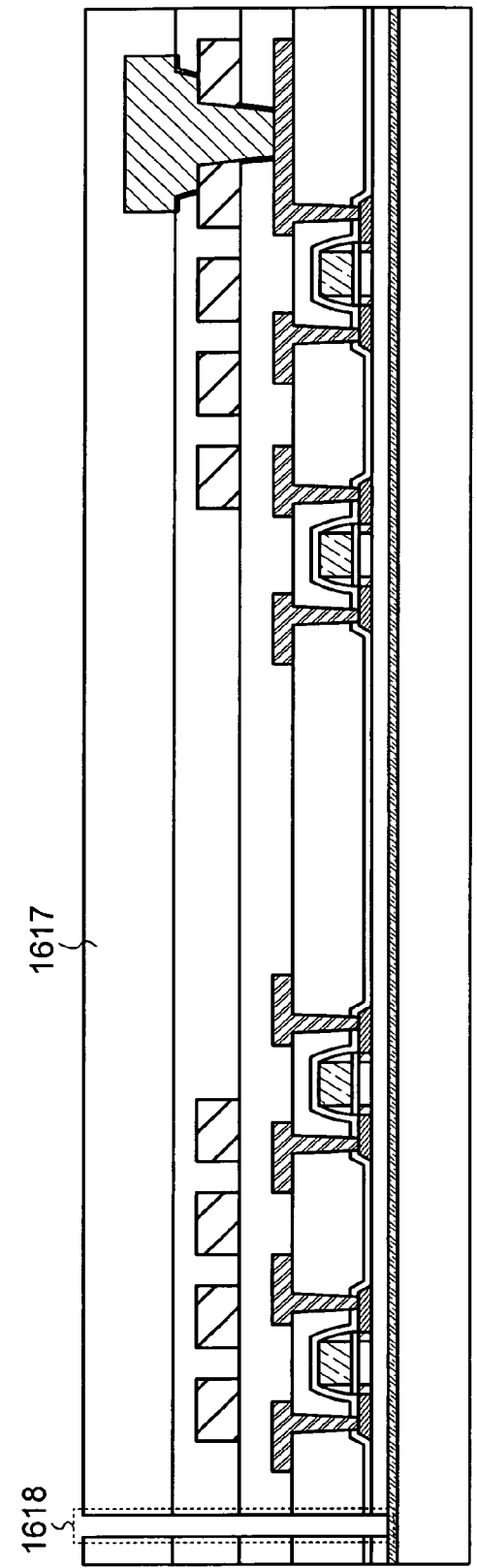

First, the resist 1616 and part of the seed layer 1615 are removed and an insulating film 1617 is formed to cover the conductive film 1630; then, an opening 1618 is formed by laser light irradiation (FIGS. 17B and 13A). Subsequently, one of surfaces of the element formation layer (here, a surface of the insulating film 1617) is bonded to a first sheet member 1620, and then, the element formation layer is separated from the substrate 1601 (FIG. 18A). As the first sheet member 1620, a hot-melt film or the like can be used. In the case where the first sheet member 1620 is separated later, a thermal peeling tape, adhesion of which is reduced by application of heat, can be used.

When separation is performed with a surface where separation is performed wetted by an aqueous solution such as water or ozone water, elements such as the thin film transistors 1630a to 1630d can be prevented from being broken down by static electricity or the like. Further, the substrate 1601 from which the element formation layer has been separated is reused, whereby cost reduction can be achieved.

Figure 13B:
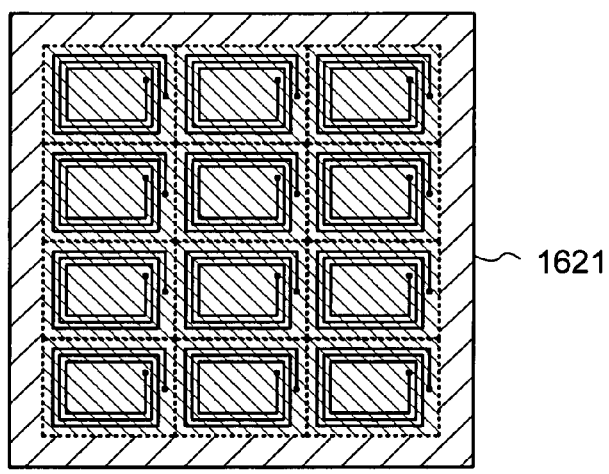

Then, the other of surfaces of the element formation layer (a surface which has been exposed by the separation from the substrate 1601) is provided with a second sheet member 1621 (FIGS. 18B and 13B). The second sheet member 1621 can be bonded to the other of surfaces of the element formation layer using a hot-melt film or the like by one of or both heat treatment and pressure treatment. In the case where a thermal peeling tape is used as the first sheet member 1620, separation can be performed by utilization of heat which is applied in bonding the second sheet member 1621.

Figure 13C:
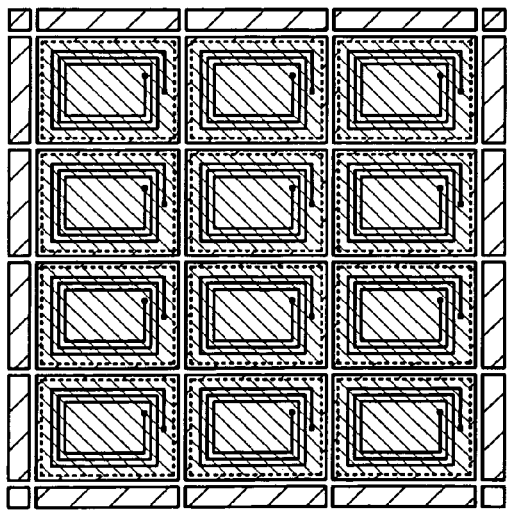

Then, the element formation layer provided over the second sheet member 1621 is selectively divided by dicing, scribing, a laser cut method, or the like, whereby a plurality of semiconductor devices can be obtained (FIG. 13C). When a flexible substrate such as plastic is used as the second sheet member 1621, a flexible semiconductor device can be manufactured.

In this embodiment mode, the case is described where after an element such as a thin film transistor or an antenna is formed over the substrate 1601, the element is separated from the substrate 1601, whereby a flexible semiconductor device is manufactured. However, the present invention is not limited thereto. For example, a semiconductor device provided with an element such as a thin film transistor or an antenna can be manufactured over the substrate 1601 through steps shown in FIGS. 14A to 17A without providing the separation layer 1602 over the substrate 1601.

This embodiment mode can be implemented by being freely combined with the structure of the semiconductor device or the method for manufacturing the semiconductor device which is described in any of other embodiment modes in this specification.

Embodiment Mode 4

This embodiment mode describes an example of a usage pattern of the semiconductor device described in the foregoing embodiment modes. Specifically, examples of an application of the semiconductor device which can input and output data without contact is described with reference to the drawings. A semiconductor device which can input and output data without contact is also referred to as an RFID tag, an ID tag, an IC tag, an IC chip, an RF tag, a wireless tag, an electronic tag, or a wireless chip depending on the usage pattern.

Figure 10A:
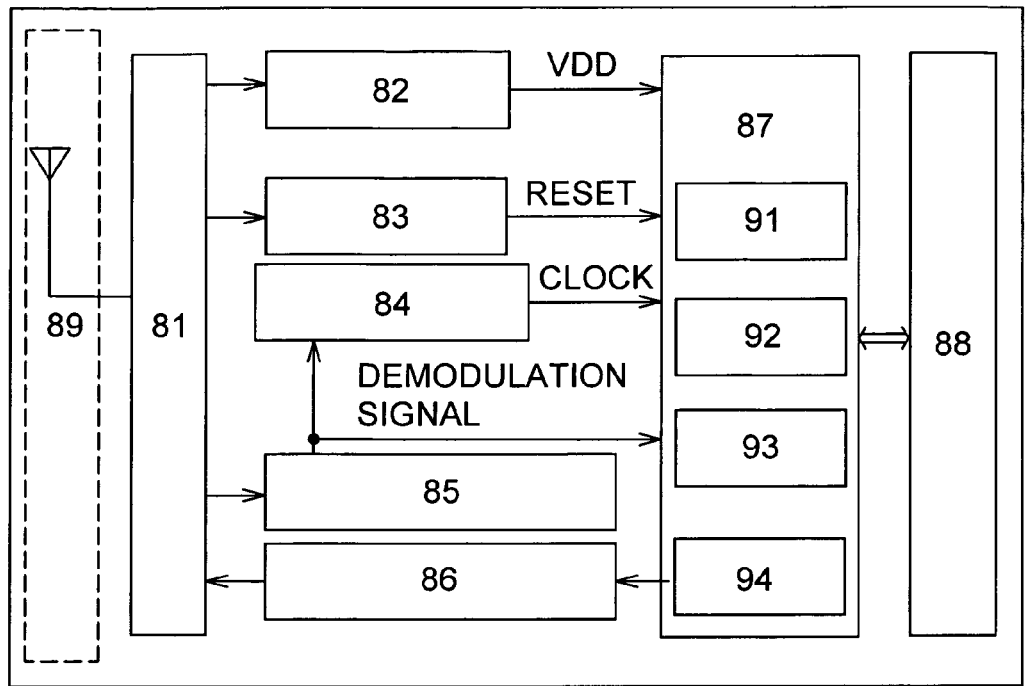
FIGS. 10A to 10C are a diagram and views each showing an example of a usage pattern of a semiconductor device of the present invention.

A semiconductor device 80 has a function of communicating data without contact, and includes a high frequency circuit 81, a power source circuit 82, a reset circuit 83, a clock generation circuit 84, a data demodulation circuit 85, a data modulation circuit 86, a control circuit 87 which controls another circuit, a storage circuit 88, and an antenna 89 (see FIG. 10A). The high frequency circuit 81 is a circuit which receives a signal from the antenna 89, and receives a signal from the data modulation circuit 86 and outputs the signal through the antenna 89. The power source circuit 82 is a circuit which generates a power source potential from the received signal. The reset circuit 83 is a circuit which generates a reset signal. The clock generation circuit 84 is a circuit which generates various clock signals based on the received signal inputted from the antenna 89. The data demodulation circuit 85 is a circuit which demodulates the received signal and outputs the signal to the control circuit 87. The data modulation circuit 86 is a circuit which modulates the signal received from the control circuit 87. In the control circuit 87, a code extraction circuit 91, a code determination circuit 92, a CRC determination circuit 93, and an output unit circuit 94 are included, for example. It is to be noted that the code extraction circuit 91 is a circuit which separately extracts a plurality of codes included in an instruction transmitted to the control circuit 87. The code determination circuit 92 is a circuit which compares the extracted code and a reference code to determine the content of the instruction. The CRC determination circuit 93 is a circuit which detects the presence or absence of a transmission error or the like based on the determined code.

Next, an example of operation of the foregoing semiconductor device is described. First, a radio signal is received by the antenna 89. The radio signal is transmitted to the power source circuit 82 via the high frequency circuit 81, and a high power source potential (hereinafter referred to as VDD) is generated. The VDD is supplied to each circuit included in the semiconductor device 80. In addition, a signal transmitted to the data demodulation circuit 85 via the high frequency circuit 81 is demodulated (hereinafter, such a signal is referred to as a demodulated signal). Further, the demodulated signal and a signal which has passed the high frequency circuit 81 and the reset circuit 83 or the clock generation circuit 84 are transmitted to the control circuit 87. The signal transmitted to the control circuit 87 is analyzed by the code extraction circuit 91, the code determination circuit 92, the CRC determination circuit 93, and the like. Then, in accordance with the analyzed signal, information of the semiconductor device which is stored in the storage circuit 88 is outputted. The outputted information of the semiconductor device is encoded by passing through the output unit circuit 94. Furthermore, the encoded information of the semiconductor device 80 is passed through the data modulation circuit 86 and transmitted by the antenna 89 as a radio signal. It is to be noted that a low power source potential (hereinafter, referred to as VSS) is common among a plurality of circuits included in the semiconductor device 80, and VSS can be GND.

In this manner, a signal is transmitted from the reader/writer to the semiconductor device 80 and a signal transmitted from the semiconductor device 80 is received by the reader/writer, thus, the data of the semiconductor device can be read.

The semiconductor device 80 may be either a type where no power supply (battery) is built-in but electromagnetic waves are used to supply a power supply voltage to each circuit, or a type where both electromagnetic waves and a power supply (battery) are used to generate a power supply voltage for each circuit.

Figure 10B:
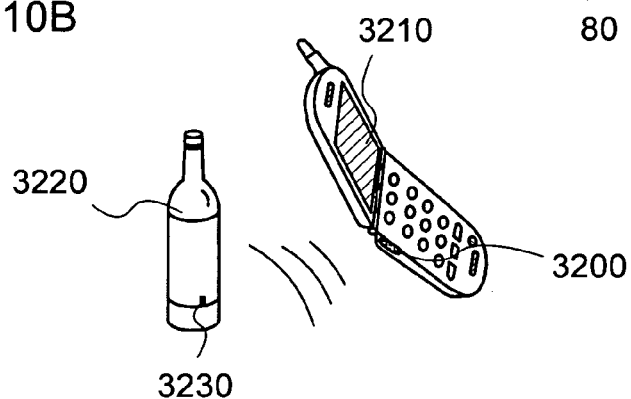
Figure 10C:
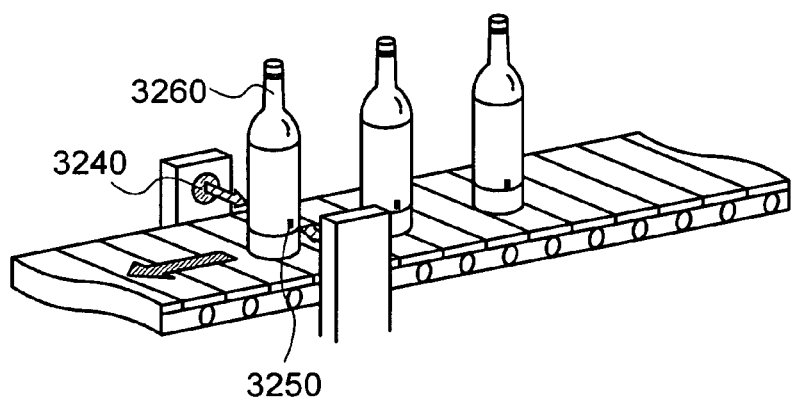
Figure 11A:
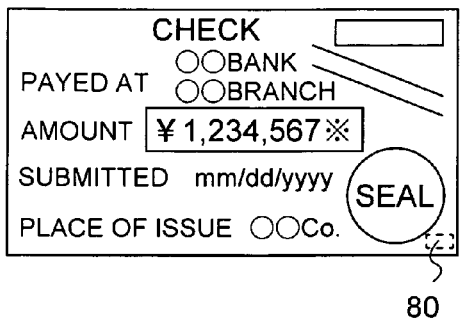
FIGS. 11A to 11H are views each showing an example of a usage pattern of a semiconductor device of the present invention.
Figure 11B:
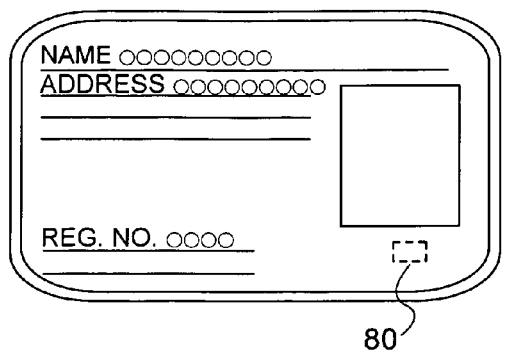
Figure 11C:
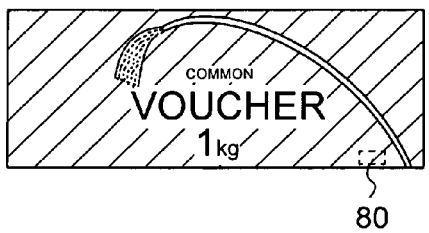
Figure 11D:
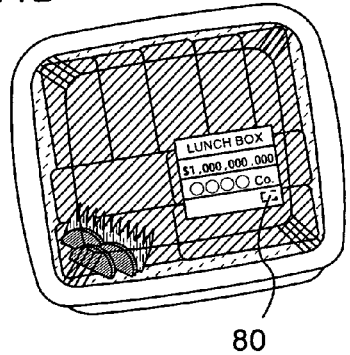
Figure 11E:
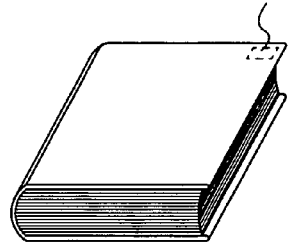
Figure 11F:
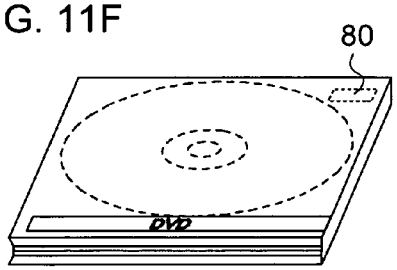
Figure 11G:
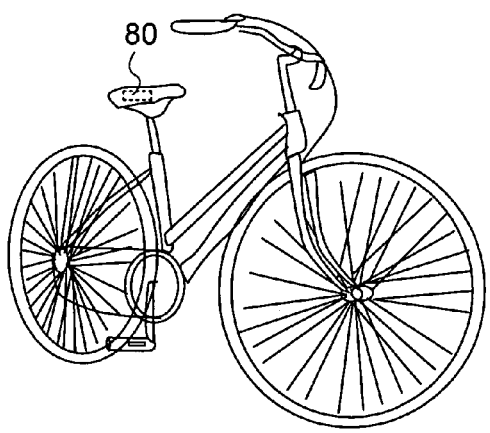
Figure 11H:
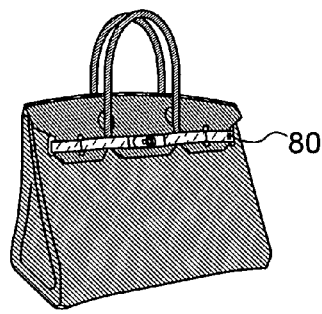

Next, an example of a usage pattern of a semiconductor device which can input and output data without contact is described. A reader/writer 3200 is attached to a side face of a portable terminal including a display portion 3210, and a semiconductor device 3230 is attached to a side face of an article 3220 (see FIG. 10B). When the reader/writer 3200 is put close to the semiconductor device 3230 included in the article 3220, information of the article 3220, such as a raw material, the place of origin, an inspection result in each production process, the history of distribution, or an explanation of the article, is displayed on the display portion 3210. Furthermore, the product 3260 can be inspected while a product 3260 is transported by a conveyor belt, using a reader/writer 3240 and a semiconductor device 3250 attached to the product 3260 (see FIG. 10C). Thus, by utilizing the semiconductor devices for systems, information can be acquired easily, and a higher function and higher added value can be realized.

As a signal transmission method in the foregoing semiconductor device which can input and output data without contact, an electromagnetic coupling method, an electromagnetic induction method, a microwave method, or the like can be used. A transmission method may be appropriately selected by a practitioner in consideration of an intended use, and an optimum antenna may be provided in accordance with the transmission method.

In the case of employing, for example, an electromagnetic coupling method or an electromagnetic induction method (e.g., a 13.56 MHz band) as a signal transmission method of the semiconductor device, electromagnetic induction caused by a change in magnetic field density is used. Therefore, the conductive film serving as an antenna is formed into an annular shape (e.g., a loop antenna) or a spiral shape (e.g., a spiral antenna).

In the case of employing, for example, a microwave method (for example, an UHF band (860 to 960 MHz band), a 2.45 GHz band, or the like) as a signal transmission method of the semiconductor device, the shape such as the length of the conductive film serving as an antenna may be appropriately set in consideration of a wavelength of an electromagnetic wave which is used for signal transmission. For example, the conductive film serving as an antenna can be formed into a linear shape (e.g., a dipole antenna), a flat shape (e.g., a patch antenna), or a ribbon-like shape.

It is to be noted that an applicable range of a semiconductor device is wide in addition to the foregoing examples, and the flexible semiconductor device can be applied to any product as long as it clarifies information such as the history of an object without contact and utilizes the information for production, management, or the like. For example, the semiconductor device can be mounted on bills, coins, securities, certificates, bearer bonds, packing containers, books, recording media, personal belongings, vehicles, food, clothing, health products, commodities, medicine, electronic appliances, and the like. Examples of them are described with reference to FIGS. 11A to 11H.

Bills and coins are money distributed to the market, and include one valid in a certain area (cash voucher), memorial coins, and the like. Securities refer to checks, certificates, promissory notes, and the like (see FIG. 11A). Certificates refer to driver's licenses, certificates of residence, and the like (see FIG. 11B). Bearer bonds refer to stamps, rice coupons, various gift certificates, and the like (see FIG. 11C). Packing containers refer to wrapping paper for food containers, plastic bottles, and the like (see FIG. 11D). Books refer to hardbacks, paperbacks, and the like (see FIG. 11E). Recording media refer to DVD software, video tapes, and the like (see FIG. 11F). Vehicles refer to wheeled vehicles like bicycles, ships, and the like (see FIG. 11G). Personal belongings refer to bags, glasses, and the like (see FIG. 11H). Food refers to food articles, drink, and the like. Clothing refers to clothes, footwear, and the like. Health products refer to medical instruments, health instruments, and the like. Commodities refer to furniture, lighting equipment, and the like. Medicine refers to medical products, pesticides, and the like. Electronic appliances refer to liquid crystal display devices, EL display devices, television sets (TV receivers and flat-screen TV receivers), cellular phones, and the like.

Forgery can be prevented by providing the semiconductor device 80 for bills, coins, securities, certificates, bearer bonds, and the like. The efficiency of an inspection system, a system used in a rental shop, and the like can be improved by providing the semiconductor device 80 for packing containers, books, recording media, personal belongings, food, commodities, electronic appliances, and the like. Forgery or theft can be prevented by providing the semiconductor device 80 for vehicles, health products, medicine, or the like; and wrong use of the medicines can be prevented. The semiconductor device 80 may be provided by, for example, being attached to the surface of an object or embedded in an object. For example, the semiconductor device 80 may be embedded in paper of a book or embedded in an organic resin of a package when the package is made of an organic resin.

In this manner, when a semiconductor device is provided for packaging containers, storage media, personal belongings, foods, clothing, commodities, electronic appliances, and the like, the efficiency of an inspection system, a rental shop system, and the like can be improved. In addition, when the semiconductor device is provided for vehicles, forgery and theft thereof can be prevented. Further, when the semiconductor device is implanted in creatures such as animals, identification of the individual creature can be easily carried out. For example, when the semiconductor device provided with a sensor is implanted in creatures such as domestic animals, not only the year of birth, sex, breed, and the like but also health conditions such as body temperature can be easily managed.

The semiconductor device described in this embodiment mode can be implemented by being freely combined with the semiconductor device described in any of the above embodiment modes.

This application is based on Japanese Patent Application serial No. 2007-100062 filed with Japan Patent Office on Apr. 6, 2007, the entire contents of which are hereby incorporated by reference.

What is claimed is:
1. A semiconductor device comprising:
an integrated circuit portion provided over a substrate;

an insulating film provided over the integrated circuit portion;
an antenna provided over the insulating film; and
a conductive film configured to electrically connect the integrated circuit portion and the antenna through a seed layer,
wherein the insulating film and the antenna have an opening, and
wherein the conductive film and the seed layer are provided in the opening and over a top surface of the antenna.

2. The semiconductor device according to claim 1, wherein the conductive film contains at least one of copper (Cu), nickel (Ni), gold (Au), platinum (Pt), silver (Ag), cobalt (Co), and tin (Sn).

3. The semiconductor device according to claim 1, wherein the conductive film is formed by a plating process.

4. The semiconductor device according to claim 1, wherein the semiconductor device is an RFID tag.

5. The semiconductor device according to claim 1, wherein the opening provided in each of the insulating film and the anntena is overlapped with a transistor in the integrated circuit portion.

6. A semiconductor device comprising:
an integrated circuit portion provided over a substrate;
an antenna provided over the integrated circuit portion; and
a conductive film configured to electrically connect the integrated circuit portion and the antenna through a seed layer,
wherein the antenna is provided by stacking a plurality of conductive films with an insulating film interposed therebetween,
wherein the plurality of conductive films and the insulating film have an opening, and
wherein the conductive film and the seed layer are provided in the opening.

7. The semiconductor device according to claim 6, wherein the conductive film contains at least one of copper (Cu), nickel (Ni), gold (Au), platinum (Pt), silver (Ag), cobalt (Co), and tin (Sn).

8. The semiconductor device according to claim 6, wherein the conductive film is formed by a plating process.

9. The semiconductor device according to claim 6, wherein the semiconductor device is an RFID tag.

10. The semiconductor device according to claim 6, wherein the conductive film is electrically connected to each of the plurality of conductive films in the opening.

11. The semiconductor device according to claim 6, wherein the opening provided in each of the insulating film and the anntena is overlapped with a transistor in the integrated circuit portion.

12. A method for manufacturing a semiconductor device comprising:
forming an integrated circuit portion including a first conductive film over a substrate;
forming an insulating film over the integrated circuit portion;
forming an antenna including a second conductive film over the insulating film;
forming an opening in the insulating film and the second conductive film to expose the first conductive film;
forming a seed layer in the opening and over a top surface of the second conductive film; and
forming a third conductive film over the seed layer by a plating process to electrically connect the first conductive film and the second conductive film.

13. The method for manufacturing a semiconductor device according to claim 12, wherein the third conductive film contains at least one of copper (Cu), nickel (Ni), gold (Au), platinum (Pt), silver (Ag), cobalt (Co), tin (Sn), and an alloy material and a compound material each including any of these elements.

14. The method for manufacturing a semiconductor device according to claim 12, wherein the semiconductor device is an RFID tag.

15. A method for manufacturing a semiconductor device comprising:
forming an integrated circuit portion including a first conductive film over a substrate;
forming a first insulating film over the integrated circuit portion;
forming an antenna by stacking a plurality of second conductive films over the first insulating film with a second insulating film interposed therebetween;
forming an opening in the first insulating film, the second conductive films, and the second insulating film to expose the first conductive film;
forming a seed layer in the opening; and
forming a third conductive film over the seed layer by a plating process to electrically connect the first conductive film and the plurality of second conductive films.

16. The method for manufacturing a semiconductor device according to claim 15, wherein the third conductive film contains at least one of copper (Cu), nickel (Ni), gold (Au), platinum (Pt), silver (Ag), cobalt (Co), tin (Sn), and an alloy material and a compound material each including any of these elements.

17. The method for manufacturing a semiconductor device according to claim 15, wherein the semiconductor device is an RFID tag.

18. The method for manufacturing a semiconductor device according to claim 15, wherein the second insulating film is formed by subjecting the plurality of second conductive films to one of or both oxidation treatment and nitridation treatment.

19. The semiconductor device according to claim 1, wherein the seed layer contains at least one of copper (Cu), nickel (Ni), and chromium (Cr).

20. The semiconductor device according to claim 6, wherein the seed layer contains at least one of copper (Cu), nickel (Ni), and chromium (Cr).

21. The method for manufacturing a semiconductor device according to claim 12, wherein the seed layer contains at least one of copper (Cu), nickel (Ni), and chromium (Cr).

22. The method for manufacturing a semiconductor device according to claim 15, wherein the seed layer contains at least one of copper (Cu), nickel (Ni), and chromium (Cr).

* * * * *